United States Patent
Moriguchi et al.

(10) Patent No.: US 9,698,128 B2
(45) Date of Patent: Jul. 4, 2017

(54) LED MODULE AND LED MODULE MOUNTING STRUCTURE

(75) Inventors: Takashi Moriguchi, Kyoto (JP); Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 383 days.

(21) Appl. No.: 13/554,264

(22) Filed: Jul. 20, 2012

(65) Prior Publication Data

US 2013/0020595 A1  Jan. 24, 2013

(30) Foreign Application Priority Data

Jul. 22, 2011  (JP) ................................. 2011-161090

(51) Int. Cl.
| | |
|---|---|
| H01L 29/20 | (2006.01) |
| H01L 33/00 | (2010.01) |
| H01L 25/075 | (2006.01) |
| H01L 23/00 | (2006.01) |
| H01L 33/62 | (2010.01) |

(52) U.S. Cl.
CPC .......... *H01L 25/0753* (2013.01); *H01L 24/97* (2013.01); *H01L 33/62* (2013.01); *H01L 2224/48091* (2013.01); *H01L 2224/48137* (2013.01); *H01L 2224/48227* (2013.01); *H01L 2224/49113* (2013.01); *H01L 2224/73265* (2013.01); *H01L 2224/97* (2013.01);
(Continued)

(58) Field of Classification Search
CPC ....... A41D 27/085; A42B 1/242; H01L 33/60; H01L 33/20; H01L 33/32; H01L 25/0753; H01L 24/97

USPC .................................. 257/79, 98, 97; 362/800
See application file for complete search history.

(56) References Cited

U.S. PATENT DOCUMENTS

| | | | | |
|---|---|---|---|---|
| 5,119,174 A | * | 6/1992 | Chen ......................... | G09F 9/33 257/98 |
| 5,977,624 A | * | 11/1999 | Heo ..................... | H01L 23/3114 257/701 |

(Continued)

FOREIGN PATENT DOCUMENTS

| | | |
|---|---|---|
| JP | 2001-345485 | 12/2001 |
| JP | 2006-24794 | 1/2006 |

(Continued)

OTHER PUBLICATIONS

Office Action, issued in the corresponding Japanese Patent application No. 2011-161090, dated Jul. 26, 2016, 10 pages.

(Continued)

*Primary Examiner* — Lex Malsawma
*Assistant Examiner* — Eric Jones
(74) *Attorney, Agent, or Firm* — Hamre, Schumann, Mueller & Larson, P.C.

(57) ABSTRACT

An LED module includes a substrate having a main surface and a rear surface located opposite the main surface, a main surface electrode located on the main surface, a plurality of penetration electrodes connected to the main surface electrode and extending through the substrate, three or more LED chips arranged on the main surface electrode along a first direction, and a case arranged on the main surface to surround the main surface electrode. The LED chips include at least one LED chip that can emit red light, at least one LED chip that can emit green light and at least one LED chip that can emit blue light.

65 Claims, 25 Drawing Sheets

(52) U.S. Cl.
CPC ............... *H01L 2924/01029* (2013.01); *H01L 2924/12041* (2013.01); *H01L 2924/181* (2013.01)

(56) References Cited

U.S. PATENT DOCUMENTS

| | | | | |
|---|---|---|---|---|
| 6,297,598 | B1* | 10/2001 | Wang | G02B 6/0068 257/E25.02 |
| 6,583,447 | B2* | 6/2003 | Wang | H01L 33/486 257/703 |
| 6,812,481 | B2* | 11/2004 | Matsumura | H01L 25/0753 257/13 |
| 7,875,899 | B2* | 1/2011 | Yasuda | H01L 25/0753 257/88 |
| 7,931,387 | B2* | 4/2011 | Song | F21K 9/00 362/235 |
| 9,006,759 | B2* | 4/2015 | Miyashita | H01L 25/0753 257/432 |
| 2002/0001192 | A1* | 1/2002 | Suehiro et al. | 362/240 |
| 2003/0189829 | A1* | 10/2003 | Shimizu et al. | 362/240 |
| 2004/0027067 | A1* | 2/2004 | Song | H01L 33/641 313/512 |
| 2004/0211970 | A1* | 10/2004 | Hayashimoto | H01L 33/486 257/98 |
| 2006/0083017 | A1* | 4/2006 | Wang et al. | 362/547 |
| 2009/0101897 | A1* | 4/2009 | Murphy et al. | 257/48 |
| 2009/0283781 | A1 | 11/2009 | Chan et al. | |
| 2010/0157583 | A1* | 6/2010 | Nakajima | H01L 25/0753 362/184 |
| 2010/0187549 | A1 | 7/2010 | Chen | |
| 2010/0277919 | A1* | 11/2010 | Okada | H01L 25/0753 362/249.02 |
| 2012/0080696 | A1* | 4/2012 | Chan | H01L 25/0753 257/91 |
| 2012/0104426 | A1* | 5/2012 | Chan | H01L 25/0753 257/89 |
| 2013/0037833 | A1* | 2/2013 | Nam | H01L 25/0753 257/88 |

FOREIGN PATENT DOCUMENTS

| | | |
|---|---|---|
| JP | 2007-042781 | 2/2007 |
| JP | 2009-021417 | 1/2009 |
| JP | 2009-260073 | 11/2009 |
| JP | 2010-034487 | 2/2010 |
| JP | 2010-073734 | 4/2010 |
| JP | 2010-097982 | 4/2010 |
| JP | 2011-014695 | 1/2011 |

OTHER PUBLICATIONS

Decision of Refusal, issued in the corresponding Japanese Patent application No. 2011-161090, dated Feb. 28, 2017, 3 pages (machine translation is provided).

Decision to Decline the Amendment, issued in the corresponding Japanese Patent application No. 2011-161090, dated Feb. 28, 2017, 13 pages (machine translation is provided).

* cited by examiner

FIG. 1
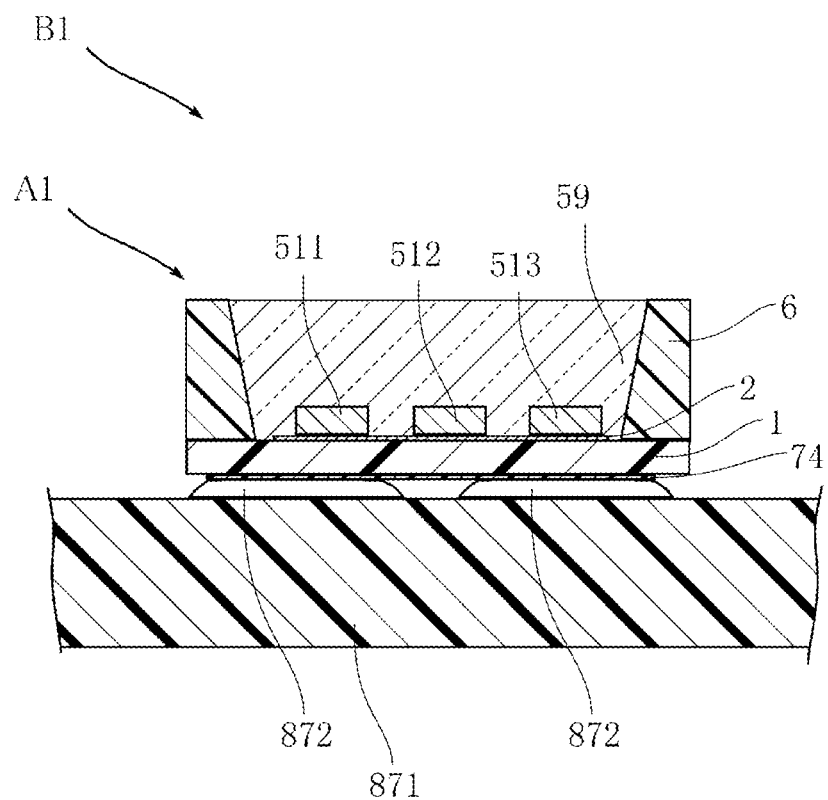
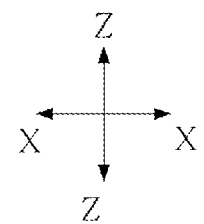

LED MODULE AND LED MODULE MOUNTING STRUCTURE

CROSS-REFERENCE TO RELATED APPLICATION

This application is based upon and claims the benefit of priority from Japanese Patent Application(s) No. 2011-161090, filed on Jul. 22, 2011, the entire contents of which are incorporated herein by reference.

TECHNICAL FIELD

The present disclosure relates to an LED module and an LED module mounting structure.

BACKGROUND

FIG. 32 shows one example of an LED module. The LED module 900 shown in FIG. 32 has a structure in which three LED chips 931, 932 and 933 are mounted on an elongated rectangular substrate 910. A plurality of electrodes 921, 922, 923 and 924 are formed in the substrate 910. The LED chips 931, 932 and 933 are wire-bonded to the electrodes 921, 922 and 923, respectively. The electrode 924 is a so-called common electrode and is electrically connected to the LED chips 931, 932 and 933 through a wire. The three LED chips 931, 932 and 933 are surrounded by a case 950. The case 950 has a substantially frame-like shape and is made of an opaque resin. The internal space of the case 950 is filled with a transparent resin (not shown). The LED module 900 is often referred to as a side view type LED module, which is mounted to a mounting substrate or the like by using a lower surface (shown in FIG. 32) extending in the longitudinal direction of the substrate 910 as a mounting surface. The LED chips 931, 932 and 933 are configured to emit red light, green light and blue light, respectively. These three types of light emitted from the LED chips 931, 932 and 933 are mixed with one another so that the LED module 900 can emit white light.

However, in recent years, there is an ever increasing demand for reduction in the size of the LED module 900. For example, the width of the substrate 910 needs to be made smaller in order to reduce the projection height of the substrate 910 from the mounting substrate to which the LED module 900 is mounted. As a consequence, a space for accommodating the LED chips 931, 932 and 933 becomes narrower. The space for accommodating the LED chips 931, 932 and 933 includes not only an installation space of the LED chips 931, 932 and 933 per se but also a space for arrangement of the wires bonded to the LED chips 931, 932 and 933 and for arrangement of the portion of the common electrode 924 to which the wires are connected. Thus, the area allocated for the electrodes 922 and 923 in the substrate 910 is not considered insignificant at all. It is therefore not easy to reduce the width of the substrate 910.

Alternatives to the side view type LED module as described above may include a top view type LED module, for which there is also a demand for reduction in the size of the top view type LED module.

SUMMARY

The present disclosure provides in some embodiments, an LED module having a reduced size.

According to a first aspect of the present disclosure, there is provided an LED module including: a substrate having a main surface and a rear surface located opposite the main surface; a main surface electrode formed on the main surface; a plurality of penetration electrodes connected to the main surface electrode and extending through the substrate; three or more LED chips arranged on the main surface electrode along a first direction; and a case arranged on the main surface to surround the main surface electrode, wherein the LED chips include at least one LED chip that can emit red light, at least one LED chip that can emit green light and at least one LED chip that can emit blue light.

In some embodiments, the main surface electrode has a portion located between the main surface and the case.

In some embodiments, the LED module further includes a plurality of wires, each of the wires being bonded to one of the LED chips and the main surface electrode.

In some embodiments, the LED module further includes: a rear surface electrode formed on the rear surface and connected to each of the penetration electrodes; and an insulating film formed on the rear surface.

In some embodiments, the wires have end portions overlapping with the rear surface electrode or the insulating film when viewed in a thickness direction of the substrate.

In some embodiments, when viewed in the thickness direction of the substrate, the insulating film is formed in a region of the rear surface other than a region where the rear surface electrode is formed.

In some embodiments, the rear surface electrode includes a plurality of mutually spaced-apart mounting pad portions, the insulating film includes a first band-like insulating portion extending in an elongated shape, and the first band-like insulating portion is located between two of the mounting pad portions.

In some embodiments, the rear surface includes an exposed portion exposed from the insulating film, the exposed portion being positioned in a marginal area of the rear surface along an extension direction of the first band-like insulating portion and the first band-like insulating portion being contiguous to the exposed portion when viewed in the thickness direction of the substrate.

In some embodiments, the insulating film includes a second band-like insulating portion extending in an elongated shape along a direction intersecting the extension direction of the first band-like insulating portion, the second band-like insulating portion being located between two of the mounting pad portions.

In some embodiments, the second band-like insulating portion reaches a peripheral end of the rear surface.

In some embodiments, the main surface electrode includes a first conductive portion and a plurality of second conductive portions insulated from the first conductive portion, and at least one of the LED chips is arranged on the first conductive portion.

In some embodiments, the first conductive portion includes a first die pad and a first wire bonding pad electrically connected to the first die pad, the first die pad and the first wire bonding pad being spaced apart from each other with a gap left therebetween, at least one of the LED chips is arranged on the first die pad, and at least one of the wires is bonded to the first wire bonding pad.

In some embodiments, the first wire bonding pad is spaced apart from the first die pad in a second direction intersecting the first direction.

In some embodiments, the first die pad is positioned between the second conductive portions and the first wire bonding pad.

In some embodiments, the first conductive portion includes a first circular pad electrically connected to the first wire bonding pad and overlapping with one of the penetration electrodes when viewed in the thickness direction of the substrate.

In some embodiments, the first circular pad has a portion located between the case and the substrate.

In some embodiments, the first conductive portion includes a band-like portion electrically connected to the first die pad.

In some embodiments, each of the second conductive portions includes a wire bonding wiring section to which one of the wires is bonded.

In some embodiments, one of the wires is bonded to each of the second conductive portions.

In some embodiments, each of the second conductive portions includes a circular wiring section electrically connected to the wire bonding wiring section and overlapping with one of the penetration electrodes when viewed in the thickness direction of the substrate.

In some embodiments, the circular wiring section is connected to the wire bonding wiring section.

In some embodiments, the circular wiring section has a portion located between the case and the substrate.

In some embodiments, the LED module further includes: a plurality of bonding layers located between each of the LED chips and the main surface electrode.

In some embodiments, at least one of the bonding layers is electrically conductive.

In some embodiments, at least one of the bonding layers has an insulation property.

In some embodiments, the LED module further includes: an adhesion layer located between the case and the substrate.

In some embodiments, one of the penetration electrodes overlaps with the case when viewed in the thickness direction of the substrate.

In some embodiments, the case has a surrounding surface surrounding the LED chips.

In some embodiments, the case has a case side surface facing the opposite side of a region surrounded by the surrounding surface.

In some embodiments, the substrate has a substrate side surface flush with the case side surface.

In some embodiments, the case has a bottom surface facing the main surface and connected to the surrounding surface and the case side surface.

In some embodiments, the bottom surface has a frame-like shape and extends flat from the surrounding surface to the case side surface.

In some embodiments, the surrounding surface is inclined with respect to the thickness direction of the substrate such that the surrounding surface makes an acute angle with the bottom surface.

In some embodiments, the LED chips are arranged on the first die pad.

In some embodiments, when viewed in the thickness direction of the substrate, at least one of the wires extends in a direction inclined with respect to the first direction and a direction orthogonal to the first direction.

In some embodiments, the first conductive portion includes a second die pad spaced apart from the first die pad and a third die pad spaced apart from the first die pad and the second die pad, and only one of the LED chips is arranged on each of the first to third die pad.

According to a second aspect of the present disclosure, there is provided an LED module mounting structure including: the LED module of the first aspect of the present disclosure; a mounting substrate; and a solder layer located between the mounting substrate and the rear surface.

According to a third aspect of the present disclosure, there is provided an LED module including: a substrate having a main surface; a main surface electrode formed on the main surface; a plurality of penetration electrodes connected to the main surface electrode and extending through the substrate; and a plurality of LED chips arranged on the main surface electrode along one direction, wherein distances between the LED chips range from 100 μm to 150 μm.

According to a fourth aspect of the present disclosure, there is provided an LED module including: a substrate including a main surface, a rear surface and a bottom surface, the main surface and the rear surface facing opposite sides of each other and being elongated rectangular in shape, and the bottom surface interconnecting long sides of the main surface and the rear surface and serving as a mounting surface of the LED module; at least one LED chip supported on the main surface of the substrate; and a wiring line formed on the substrate and electrically connected to the LED chip, wherein the substrate includes at least one through-hole extending from the main surface to the rear surface, and wherein the wiring line includes at least one pad formed on the main surface and electrically connected to the LED chip, a rear surface electrode formed on the rear surface and at least one penetration electrode formed on the inner surface of the through-hole to electrically interconnect the pad and the rear surface electrode.

In some embodiments, the wiring line is not formed on the bottom surface of the substrate.

In some embodiments, the number of said at least one LED chip is three and the three LED chips are arranged along a longitudinal direction of the main surface and spaced apart from one another.

In some embodiments, the number of said at least one through-hole is three and the number of said at least one penetration electrode is three.

In some embodiments, the LED module further includes: a first wire, wherein said at least one pad of the wiring line includes a bonding pad and one of the three LED chips and the bonding pad are interconnected via the first wire, and wherein one of the three through-holes and the bonding pad overlap with each other when viewed in a thickness direction of the substrate and one of the three penetration electrodes and the bonding pad are electrically connected to each other.

In some embodiments, said at least one pad of the wiring line includes two die bonding pads to which two of the three LED chips are die-bonded, the two die bonding pads overlapping with two of the three through-holes when viewed in the thickness direction of the substrate.

In some embodiments, the rear surface electrode includes two individual electrodes electrically connected to the two die bonding pads through two of the three penetration electrodes.

In some embodiments, the substrate includes a pair of side surfaces interconnecting both ends of the main surface in the longitudinal direction and both ends of the rear surface in the longitudinal direction, wherein two corner grooves extending in the thickness direction of the substrate to reach from the main surface to the rear surface are formed between the side surfaces and the bottom surface, and wherein the wiring line includes two corner groove wiring lines formed in the inner surfaces of the two corner grooves.

In some embodiments, the rear surface electrode includes an end portion common electrode connected to one of the two corner groove wiring lines and electrically connected to the three LED chips and an end portion individual electrode connected to the other of the two corner groove wiring lines and electrically connected to one of the three LED chips.

In some embodiments, the wiring line includes a rear surface junction wiring line formed in the rear surface to interconnect one of the three penetration electrodes, which is not electrically connected to the two individual electrodes, and the end portion common electrode.

In some embodiments, each of the corner grooves has a quarter-circular cross section.

In some embodiments, the LED module further includes: a reflector formed on the main surface and having a reflecting surface configured to surround the three LED chips; and a transparent resin portion filled in a region surrounded by the reflecting surface to cover the three LED chips.

In some embodiments, the LED module further includes: a second wire configured to interconnect one of the three LED chips and the bonding pad, wherein the second wire having a portion overlapping, when viewed in the thickness direction of the substrate, with one of the three LED chips to which the first wire is connected.

In some embodiments, the center of one of the three LED chips to which the first wire is connected is misaligned, when viewed in a transverse direction of the main surface, with the center of one of the three LED chips to which the second wire is connected.

In some embodiments, when viewed in the thickness direction of the substrate, one of the three through-holes includes a portion overlapping with one of the three LED chips to which the second wire is connected and a portion protruding from said one of the three LED chips.

In some embodiments, the LED module further includes: an insulating film covering the rear surface electrode.

In some embodiments, the insulating film covers the rear surface junction wiring line.

In some embodiments, the insulating film exposes at least a portion of each of the individual electrodes.

In some embodiments, the insulating film covers portions of the individual electrodes adjoining the rear surface junction wiring line.

In some embodiments, the insulating film exposes the end portion common electrode and the end portion individual electrode.

Other features and advantages of the present disclosure will become more apparent from the following description of embodiments given in conjunction with the accompanying drawings.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a sectional view showing an LED module mounting structure according to a first embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the aspects of present disclosure. However, it will be apparent to one of ordinary skill in the art that some aspects of the present disclosure may be practiced without these specific details. In other instances, well-known methods, procedures, systems, and components have not been described in detail so as not to unnecessarily obscure aspects of the various embodiments.

A first embodiment of the present disclosure will be described with reference to FIGS. 1 through 14.

An LED module mounting structure B1 shown in FIG. 1 includes an LED module A1, a mounting substrate 871 and a solder layer 872.

The mounting substrate 871 is, e.g., a printed wiring substrate. The mounting substrate 871 includes, e.g., an insulating substrate and pattern electrodes (not shown) formed in the insulating substrate. The LED module A1 is placed on the mounting substrate 871. The solder layer 872 is located between the LED module A1 and the mounting substrate 871. The solder layer 872 bonds the LED module A1 and the mounting substrate 871 together.

Figure 2:
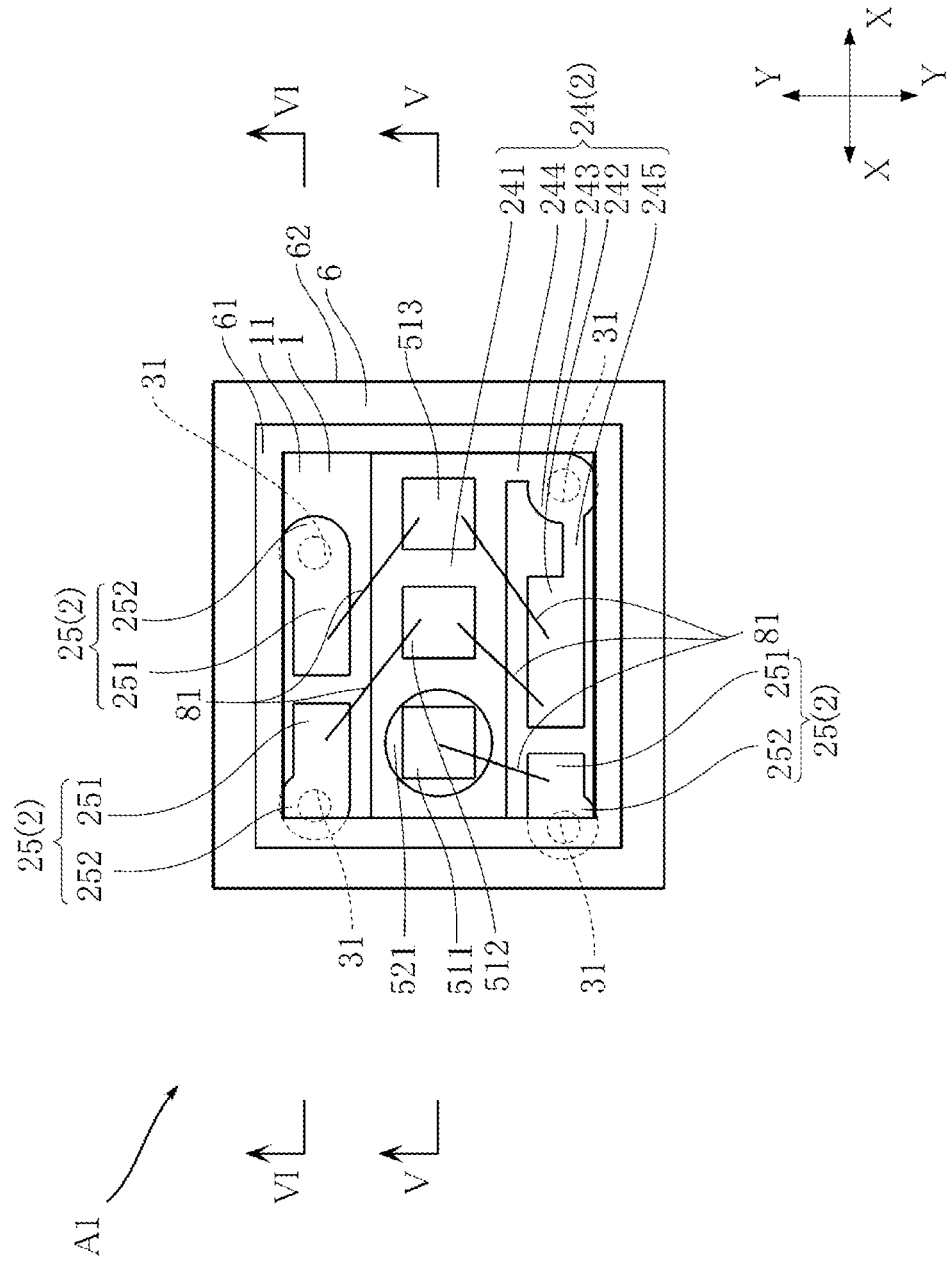
FIG. 2 is a plan view of an LED module according to the first embodiment of the present disclosure.
Figure 3:
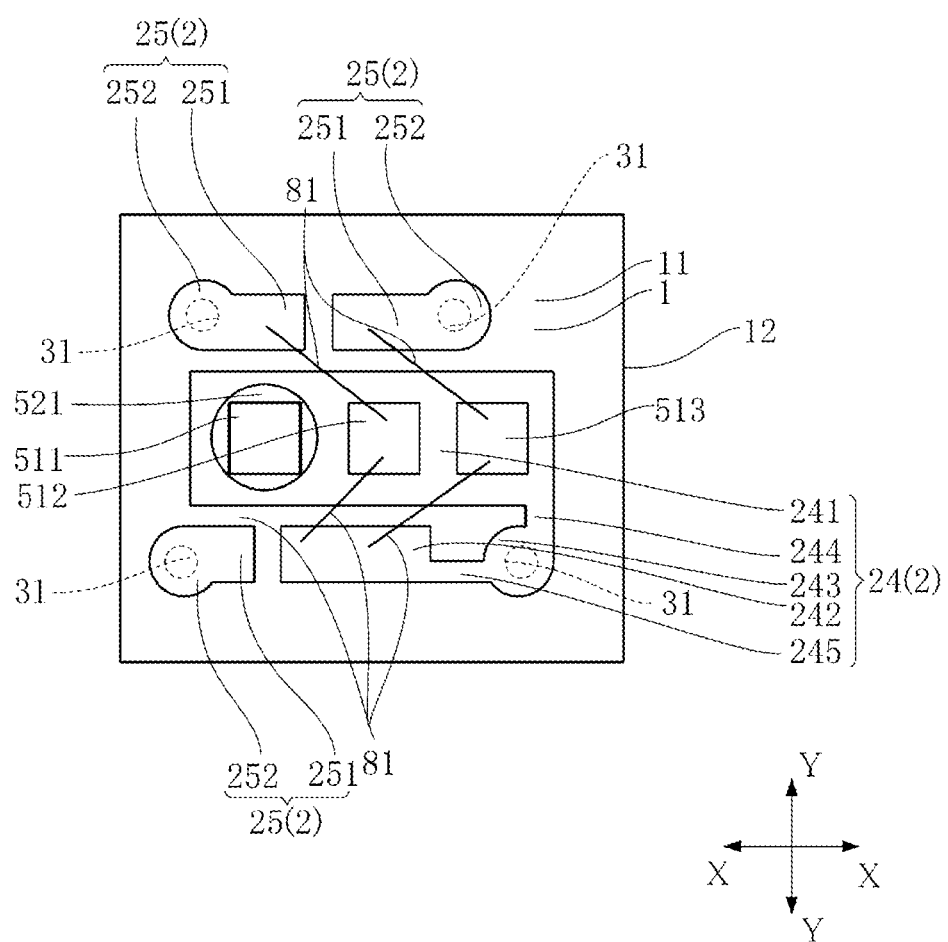
FIG. 3 is a plan view of the LED module of FIG. 2 with a case and an adhesion layer omitted.
Figure 4:
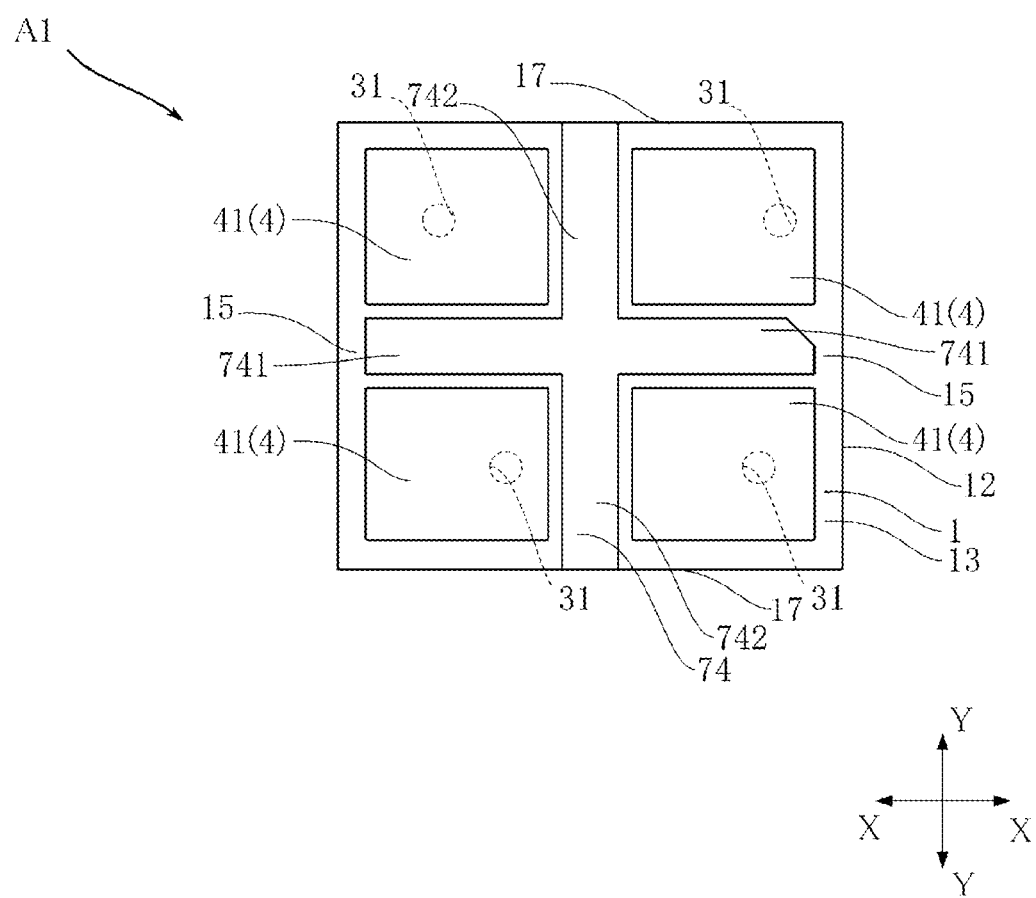
FIG. 4 is a bottom view of the LED module according to the first embodiment of the present disclosure.
Figure 5:
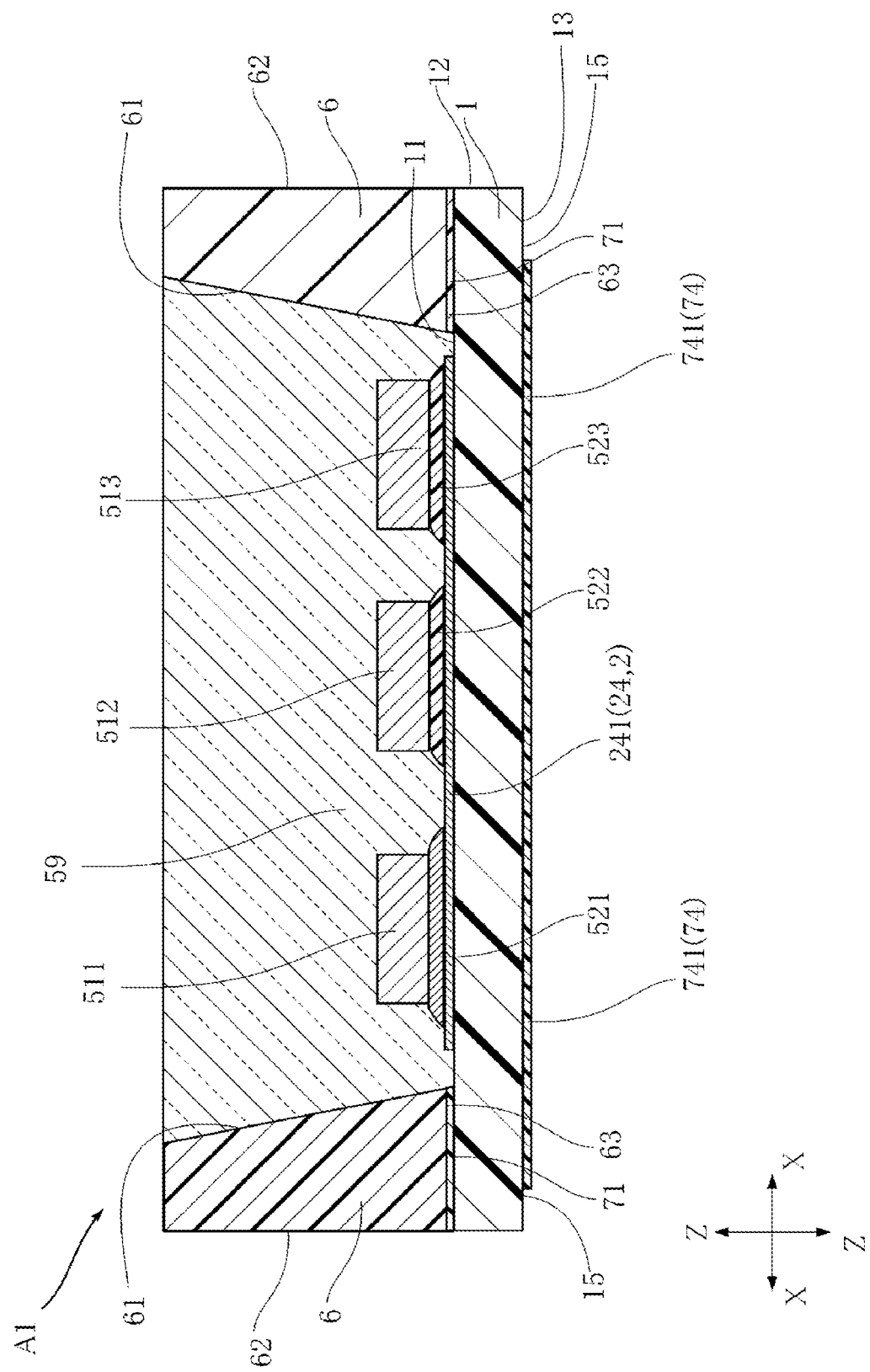
FIG. 5 is a sectional view taken along line V-V in FIG. 2.
Figure 6:
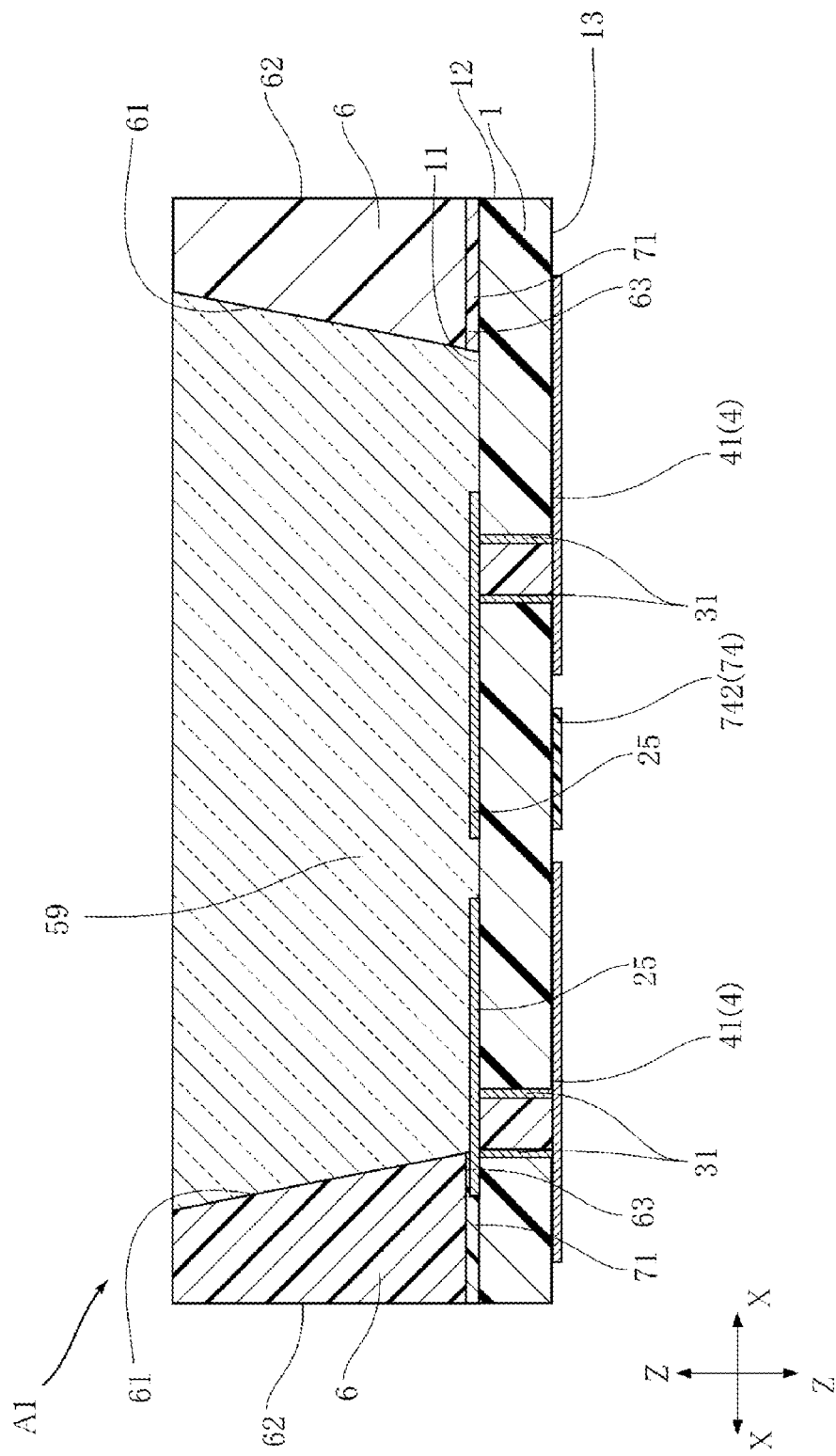
FIG. 6 is a sectional view taken along line VI-VI in FIG. 2.

FIG. 2 is a plan view of the LED module A1 according to the present embodiment. FIG. 3 is a plan view of the LED module A1 of FIG. 2 with a case and an adhesion layer omitted. FIG. 4 is a bottom view of the LED module A1 according to the present embodiment. FIG. 5 is a section view taken along line V-V in FIG. 2. FIG. 6 is a section view taken along line VI-VI in FIG. 2.

The LED module A1 shown in these figures is a top view type LED module. In other words, the LED module A1 irradiates light in the thickness direction of the mounting substrate 871. The LED module A1 includes a substrate 1, a main surface electrode 2, a plurality of penetration electrodes 31, a rear surface electrode 4, a plurality of LED chips 511, 512 and 513, a plurality of bonding layers 521, 522 and 523, an sealing resin portion 59, a case 6, an adhesion layer 71, an insulating film 74 and a plurality of wires 81. In FIG. 2, the sealing resin portion 59 is omitted for the sake of understanding. FIG. 5 corresponds to an enlarged view of the LED module A1 shown in FIG. 1. In FIG. 1, the bonding layers 521, 522 and 523 and the adhesion layer 71 are omitted for the sake of understanding. In FIGS. 2 and 3, the bonding layers 522 and 523 are omitted. The dimension of the LED module A1 in the X and Y directions is, e.g., approximately 1.6 mm to 1.8 mm.

The LED chips 511, 512 and 513 are light sources of the LED module A1. Each of the LED chips 511, 512 and 513 has a structure in which a p-type semiconductor layer, an n-type semiconductor layer and an active layer are laminated one above another. The active layer is located between the p-type semiconductor layer and the n-type semiconductor layer. In the present embodiment, the LED chip 511 emits red light, the LED chip 512 emits green light and LED chip 513 emits blue light. The LED chips 511, 512 and 513 are arranged along the X direction. The distances between the LED chips 511 and 512 and between the LED chips 512 and 513 may range from 100 μm to 150 μm.

The substrate 1 has a rectangular shape in a plan view. The substrate 1 is made of, e.g., a glass epoxy resin. The substrate 1 includes a main surface 11, substrate side surfaces 12 and a rear surface 13. The main surface 11 and the rear surface 13 are located opposite one another and face opposite directions. The substrate side surfaces 12 face one side in the X direction or one side in the Y direction. The substrate side surfaces 12 are connected to both the main surface 11 and the rear surface 13. The main surface 11, the substrate side surfaces 12 and the rear surface 13 are flat. The solder layer 872 is located between the rear surface 13 and the mounting substrate 871.

The main surface electrode 2 is formed on the main surface 11. The main surface electrode 2 includes a first conductive portion 24 and a plurality of second conductive portions 25. The main surface electrode 2 is formed by laminating copper, nickel and gold one above another. This holds true for the penetration electrodes 31 and the rear surface electrode 4 to be described later.

At least one of the LED chips 511, 512 and 513 is arranged in the first conductive portion 24. The first conductive portion 24 includes a die pad 241, a wire bonding pad 242, a circular pad 243 and band-like portions 244 and 245.

The die pad 241 has a rectangular shape. At least one of the LED chips 511, 512 and 513 is arranged in the die pad 241. In the present embodiment, all the LED chips 511, 512 and 513 are arranged in the die pad 241.

The wire bonding pad 242 has a rectangular shape. In the present embodiment, the wire bonding pad 242 is formed into a rectangular shape such that the long side thereof extends in the X direction. At least one of the wires 81 is bonded to the wire bonding pad 242. In the present embodiment, two of the wires 81 are bonded to the wire bonding pad 242. The die pad 241 is spaced apart from the wire bonding pad 242 with a gap left therebetween. More specifically, the wire bonding pad 242 is spaced apart from the die pad 241 in the Y direction. When viewed in the direction Z, the lengths of the wires 81 range, e.g., from 0.4 mm to 0.6 mm.

The circular pad 243 has a circular shape when viewed in the Z direction. In the present embodiment, the circular pad 243 is located on the same side as the wire bonding pad 242 with respect to the die pad 241. The circular pad 243 is located on one side in the X direction with respect to the wire bonding pad 242. The circular pad 243 is electrically connected to the die pad 241 and the wire bonding pad 242.

The band-like portion 244 extends in a band shape along the Y direction. The band-like portion 244 is electrically connected to the die pad 241. In the present embodiment, the band-like portion 244 is electrically connected to the circular pad 243. The band-like portion 244 is connected to the die pad 241 and the circular pad 243.

The band-like portion 245 extends in a band shape along the X direction. The band-like portion 245 is electrically connected to the wire bonding pad 242. In the present embodiment, the band-like portion 245 is electrically connected to the circular pad 243. The band-like portion 245 is connected to the wire bonding pad 242 and the circular pad 243. As the band-like portion 245 becomes thinner, the exposed area of the main surface 11 grows larger. If the reflectance of the main surface 11 is higher than that of the band-like portion 245, the increase in the exposed area of the main surface 11 assists in increasing the intensity of light traveling in the Z direction of the LED module A1.

As set forth above, the die pad 241, the wire bonding pad 242, the circular pad 243 and the band-like portions 244 and 245 are electrically connected to one another.

The plurality of (three, in the present embodiment) second conductive portions 25 are insulated from the first conductive portion 24. One of the wires 81 is bonded to each of the second conductive portions 25. The die pad 241 is positioned between two of the second conductive portions 25. The die pad 241 is positioned between the rest of the second conductive portions 25 and the wire bonding pad 242.

Each of the second conductive portions 25 includes a wire bonding wiring section 251 and a circular wiring section 252.

The wire bonding wiring section 251 has a rectangular shape. One of the wires 81 is bonded to the wire bonding wiring section 251. The die pad 241 is spaced apart from the wire bonding wiring section 251 with a gap left therebetween. More specifically, the wire bonding wiring section 251 is spaced apart from the die pad 241 in the Y direction.

The circular wiring section 252 has a circular shape when viewed in the Z direction. The circular wiring section 252 is arranged at one side in the X direction with respect to the wire bonding wiring section 251. The circular wiring section 252 is electrically connected to the wire bonding wiring section 251.

Each of the plurality of (five, in the present embodiment) wires 81 is bonded to one of the LED chips 511, 512 and 513 and the main surface electrode 2. Each of the wires 81 is made of gold, silver or copper. In the present embodiment, each of the wires 81 is made of gold. When viewed in the thickness Z direction of the substrate 1, the respective wires 81 extend in the directions inclined with respect to the X direction and the Y direction. The height of each of the wires 81 from the LED chips 511, 512 and 513 ranges, e.g., from 110 μm to 130 μm.

The bonding layer 521 is located between the LED chip 511 and the main surface electrode 2. In the present embodiment, the bonding layer 521 is located between the LED chip 511 and the die pad 241 (the first conductive portion 24). The bonding layer 521 serves to bond the LED chip 511 to the main surface electrode 2 (the die pad 241 or the first conductive portion 24 in the present embodiment). The bonding layer 521 is electrically conductive. For example, silver paste is used in forming the electrically conductive bonding layer 521. Since the bonding layer 521 is electrically conductive, the LED chip 511 and the main surface electrode 2 (the die pad 241 or the first conductive portion 24 in the present embodiment) are electrically connected to each other through the bonding layer 521. When viewed in the direction Z, the bonding layer 521 occupies a wider area than the LED chip 511 occupies. If the bonding layer 521 has a circular shape when viewed in the Z direction, the diameter of the circle is, e.g., approximately 1.5 to 2 times as large as the length of one side of the tetragon defining the LED chip 511.

The bonding layer 522 is located between the LED chip 512 and the main surface electrode 2. In the present embodiment, the bonding layer 522 is located between the LED chip 512 and the die pad 241 (the first conductive portion 24). The bonding layer 522 serves to bond the LED chip 512 to the main surface electrode 2 (the die pad 241 or the first conductive portion 24 in the present embodiment). In the present embodiment, the bonding layer 522 has an insulation property.

The bonding layer 523 is located between the LED chip 513 and the main surface electrode 2. In the present embodiment, the bonding layer 523 is located between the LED chip 513 and the die pad 241 (the first conductive portion 24). The bonding layer 523 serves to bond the LED chip 513 to the main surface electrode 2 (the die pad 241 or the first conductive portion 24 in the present embodiment). In the present embodiment, the bonding layer 523 has an insulation property.

The rear surface electrode 4 is formed on the rear surface 13. The rear surface electrode 4 is a mounting electrode. The solder layer 872 (see FIG. 1) is located between the rear surface electrode 4 and the mounting substrate 871. The rear surface electrode 4 includes a plurality of (four, in the present embodiment) mounting pad portions 41.

The mounting pad portions 41 have a rectangular shape. Needless to say, the shape of the mounting pad portions 41 is not limited to a rectangular shape. The mounting pad portions 41 are spaced apart from one another.

The penetration electrodes 31 extend through the substrate 1. More specifically, each of the penetration electrodes 31 extends from the main surface 11 to the rear surface 13 through the substrate 1. The penetration electrodes 31 cover the inner surfaces of through-holes formed in the substrate 1. In the present embodiment, each of the penetration electrodes 31 has a film-like shape. Therefore, each of the penetration electrodes 31 has a cylindrical shape extending in the Z direction. In the present embodiment, a resin is filled in the space surrounded by each of the penetration electrodes 31. Each of the penetration electrodes 31 is connected to the main surface electrode 2 and the rear surface electrode 4. More specifically, the circular pad 243 is connected to one of the penetration electrodes 31 and overlaps with one of the penetration electrodes 31 when viewed in the direction Z. Each of the circular wiring sections 252 is connected to one of the penetration electrodes 31. When viewed in the direction Z, the circular wiring sections 252 overlap with the penetration electrodes 31.

The insulating film 74 is formed on the rear surface 13. The insulating film 74 is a resist layer and referred to as a solder resist. The insulating film 74 serves to prevent the solder layer 872 from adhering to the rear surface 13. In the present embodiment, when viewed in the thickness direction Z of the substrate 1, the insulating film 74 is formed in the region on the rear surface 13 other than the region where the rear surface electrode 4 is formed. When viewed in the thickness direction Z of the substrate 1, the end portion of each of the wires 81 overlaps with the insulating film 74 or the rear surface electrode 4.

The insulating film 74 includes a plurality of (two, in the present embodiment) first band-like insulating portions 741 and a plurality of (two, in the present embodiment) second band-like insulating portions 742.

Each of the first band-like insulating portions 741 extends in an elongated shape. In the present embodiment, each of the first band-like insulating portions 741 extends in the X direction. Each of the first band-like insulating portions 741 is located between two of the mounting pad portions 41. More specifically, the first band-like insulating portion 741 arranged at the left side in FIG. 4 is located between the left two mounting pad portions 41. On the other hand, the first band-like insulating portion 741 arranged at the right side in FIG. 4 is located between the right two mounting pad portions 41. None of the first band-like insulating portions 741 reaches the peripheral end 17 of the rear surface 13. In other words, an exposed portion 15 is positioned in the marginal area of the rear surface 13 in the extension direction (the X direction in the present embodiment) of the first band-like insulating portion 741 arranged at the left side in FIG. 4. The first band-like insulating portion 741 arranged at the left side in FIG. 4 is contiguous to the exposed portion 15. The reason for forming the exposed portion 15 in the substrate 1 is that an insulating film elongated in the X direction is not formed in the substrate 1' to be described later in order to prevent the substrate 1' from being bent. Similarly, an exposed portion 15 is positioned in the marginal area of the rear surface 13 along the extension direction (the X direction in the present embodiment) of the first band-like insulating portion 741 arranged at the right side in FIG. 4. The first band-like insulating portion 741 arranged at the right side in FIG. 4 is contiguous to the exposed portion 15. The reason for forming the exposed portion 15 in the substrate 1 is that an insulating film elongated in the direction X is not formed in the substrate 1'. If the insulating film elongated in the direction X is not formed in the substrate 1', the substrate 1' can be prevented from being bent.

Each of the second band-like insulating portions 742 extends in an elongated shape. Each of the second band-like insulating portions 742 extends in the direction intersecting the extension direction of each of the first band-like insulating portions 741. In the present embodiment, each of the second band-like insulating portions 742 extends in the direction Y. Each of the second band-like insulating portions 742 located between two of the mounting pad portions 41. More specifically, the second band-like insulating portion 742 arranged at the upper side in FIG. 4 located between the upper two mounting pad portions 41. On the other hand, the second band-like insulating portion 742 arranged at the lower side in FIG. 4 is located between the lower two mounting pad portions 41. Each of the second band-like insulating portions 742 reaches the peripheral end 17 of the rear surface 13.

The case 6 is arranged on the main surface 11. The case 6 surrounds the LED chips 511, 512 and 513. In the present embodiment, the case 6 has a frame-like shape. The case 6 is made of an insulating material. Examples of the insulating material include polyphthalamide (PPA), liquid crystal polymer (LCP), silicon resin and epoxy resin. The case 6 may have a white color, a black color or a color other than white or black. The main surface electrode 2 is located between the case 6 and the main surface 11. More specifically, the circular pad 243 is interposed between the case 6 and the main surface 11. Moreover, the circular wiring sections 252 are located between the case 6 and the main surface 11. If the main surface electrode 2 is reliably interposed between the case 6 and the main surface 11, the case 6 can be prevented from being inclined with respect to the main surface 11. When viewed in the Z direction, the case 6 overlaps with one of the penetration electrodes 31.

The case 6 includes a surrounding surface 61, a case side surface 62 and a bottom surface 63.

The surrounding surface 61 surrounds the LED chips 511, 512 and 513. The surrounding surface 61 is inclined with respect to the thickness direction (Z direction) of the substrate 1 so as to make an acute angle with the bottom surface 63. The inclination angle of the surrounding surface 61 with respect to the bottom surface 63 ranges, e.g., from 80 degrees to 85 degrees.

The case side surface 62 faces away from the region surrounded by the surrounding surface 61. The shortest distance between the case side surface 62 and the surrounding surface 61 ranges, e.g., from 50 μm to 100 μm. The case side surface 62 and the substrate side surface 12 are flush with each other.

The bottom surface 63 faces the main surface 11. The bottom surface 63 has a frame-like shape. The bottom surface 63 extends flat from the surrounding surface 61 to the case side surface 62. The main surface electrode 2 is located between the bottom surface 63 and the main surface 11. More specifically, the circular pad 243 is located between the bottom surface 63 and the main surface 11. In addition, the circular wiring sections 252 are located between the bottom surface 63 and the main surface 11.

The adhesion layer 71 attaches the case 6 to the main surface 11. The adhesion layer 71 serves to fix the case 6 to the substrate 1. The adhesion layer 71 is located between the case 6 and the substrate 1. More specifically, the adhesion layer 71 is located between the main surface 11 and the bottom surface 63. The adhesion layer 71 is formed by, e.g., curing a liquid adhesive agent. Examples of the liquid adhesive agent include a UV-based adhesive agent and an acryl-based adhesive agent.

The sealing resin portion 59 is arranged in the region surrounded by the case 6. The sealing resin portion 59 covers the main surface 11, the main surface electrode 2, the LED chips 511, 512 and 513, the bonding layers 521, 522 and 523, the surrounding surface 61 and the adhesion layer 71. The sealing resin portion 59 is made of a transparent resin or a resin transmitting the light emitted from the LED chips 511, 512 and 513.

Next, a brief description will be made on a manufacturing method of the LED module A1. Components similar to or identical with those described above will be designated by similar reference symbols.

Figure 7:
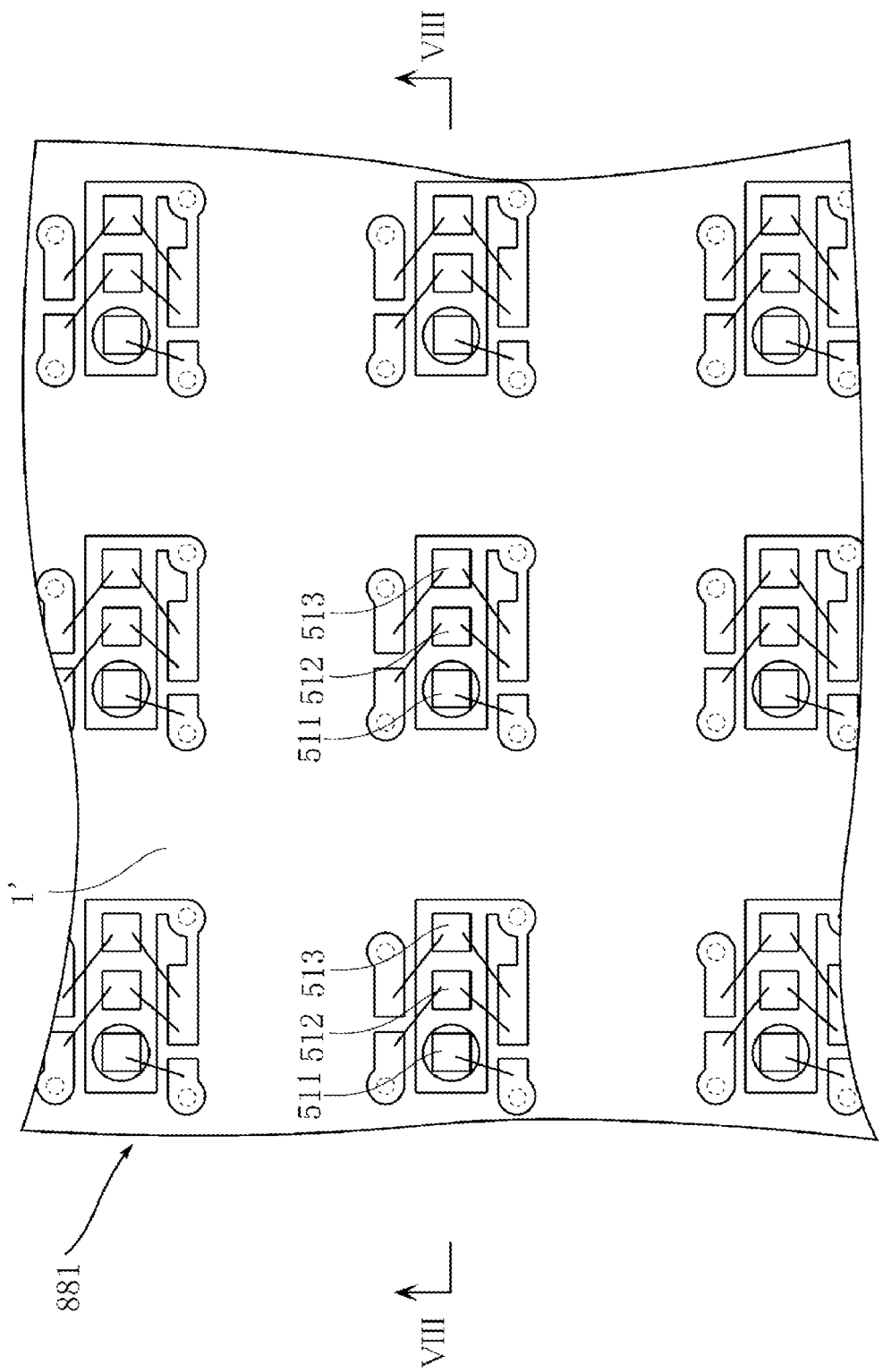
FIG. 7 is a plan view illustrating one step of a manufacturing process of the LED module according to the first embodiment of the present disclosure.
Figure 8:
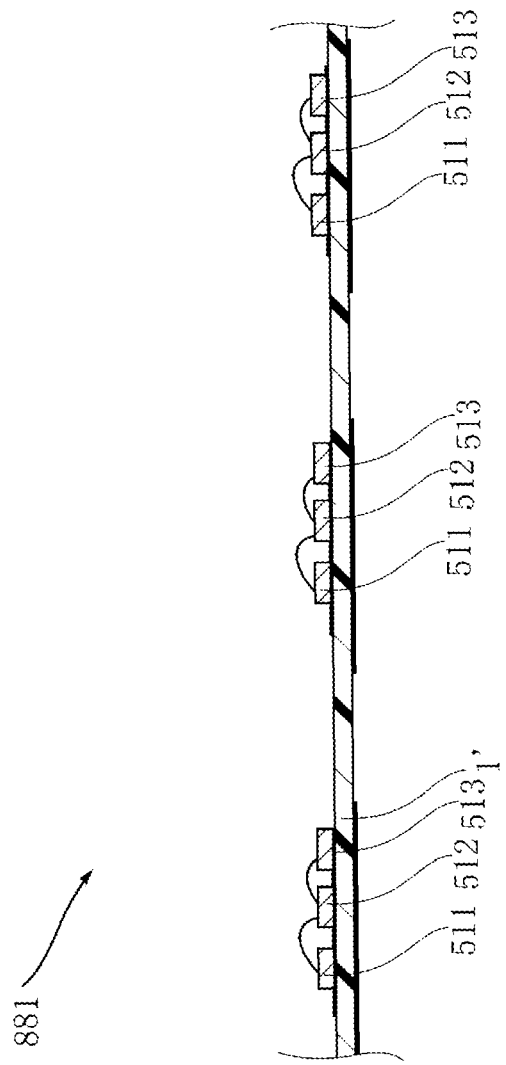
FIG. 8 is a sectional view taken along line VIII-VIII in FIG. 7.

FIG. 7 is a plan view illustrating one step of a manufacturing process of manufacturing the LED module A1. FIG. 8 is a sectional view taken along line VIII-VIII in FIG. 7. In these figures, there is shown an intermediate product 881 manufactured in the manufacturing process of the LED module A1. The substrate 1' of the intermediate product 881 is diced later into a plurality of substrates 1. In the intermediate product 881, the LED chips 511, 512 and 513 stated above are previously arranged on the substrate 1'.

Figure 9:
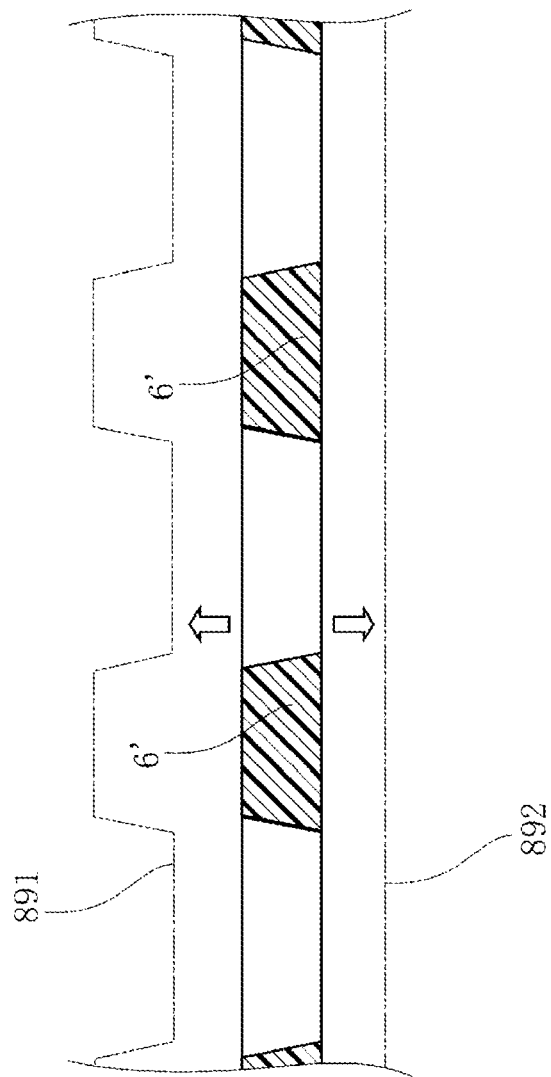
FIG. 9 is a sectional view illustrating a case forming step.

FIG. 9 is a sectional view illustrating one step of a method for forming a case 6'. The case 6' is diced later into a plurality of cases 6. As shown in FIG. 9, a first mold 891 and a second mold 892 are used in forming the case 6'. A resin material is poured into a space between the first mold 891 and the second mold 892 in a state where the first mold 891 and the second mold 892 are combined together. The case 6' is obtained by curing the resin material.

Figure 10:
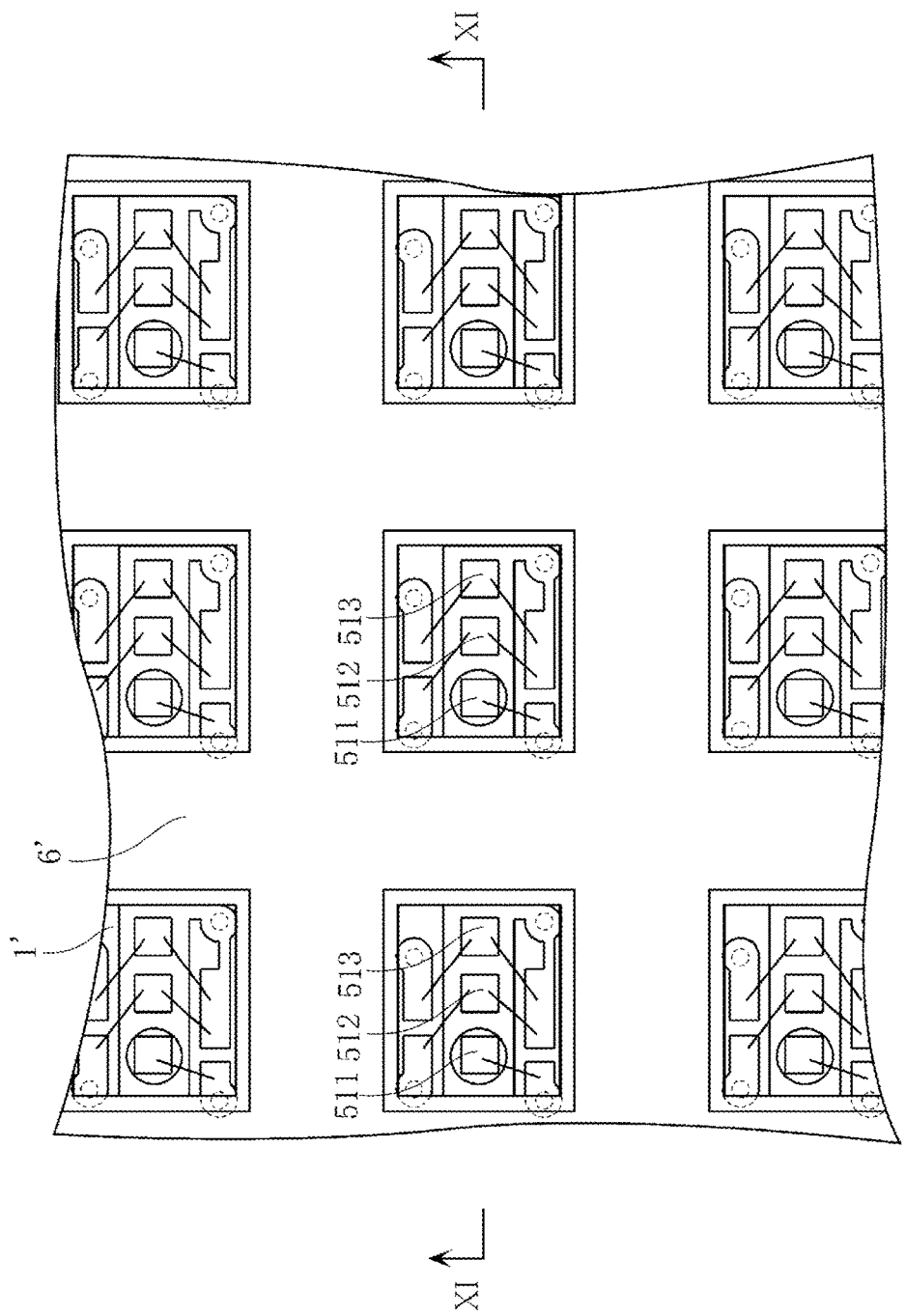
FIG. 10 is a plan view illustrating a step subsequent to the step shown in FIG. 7.
Figure 11:
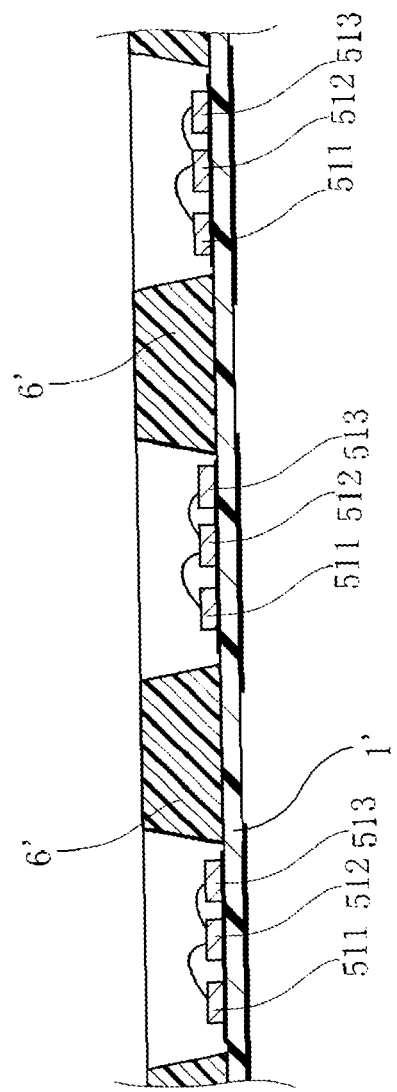
FIG. 11 is a sectional view taken along line XI-XI in FIG. 10.

Next, as shown in FIGS. 10 and 11, the case 6' is bonded to the substrate 1' through the use of the adhesion layer 71 (not shown in FIGS. 10 and 11).

Figure 12:
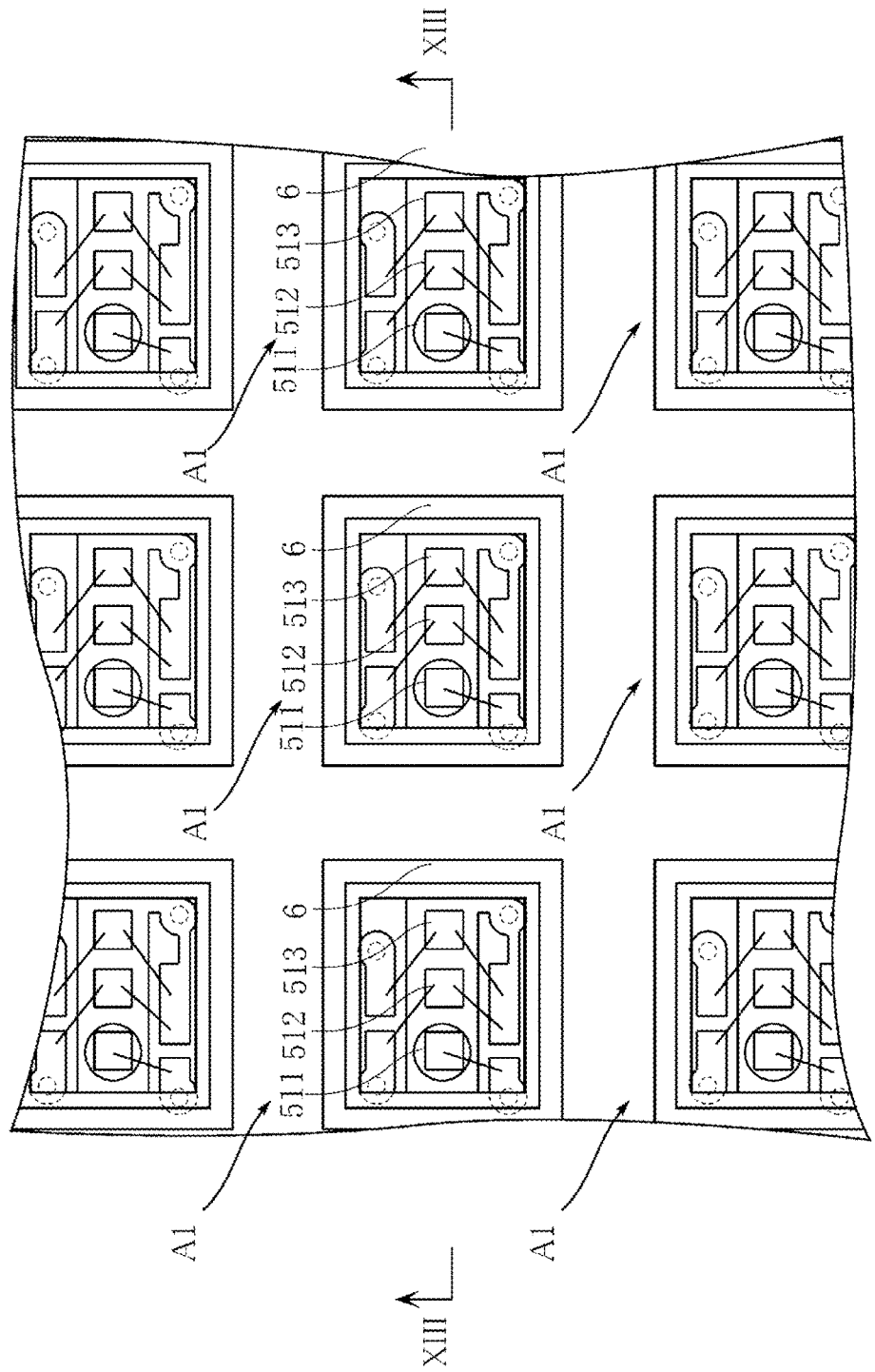
FIG. 12 is a plan view illustrating a step subsequent to the step shown in FIG. 10.
Figure 13:
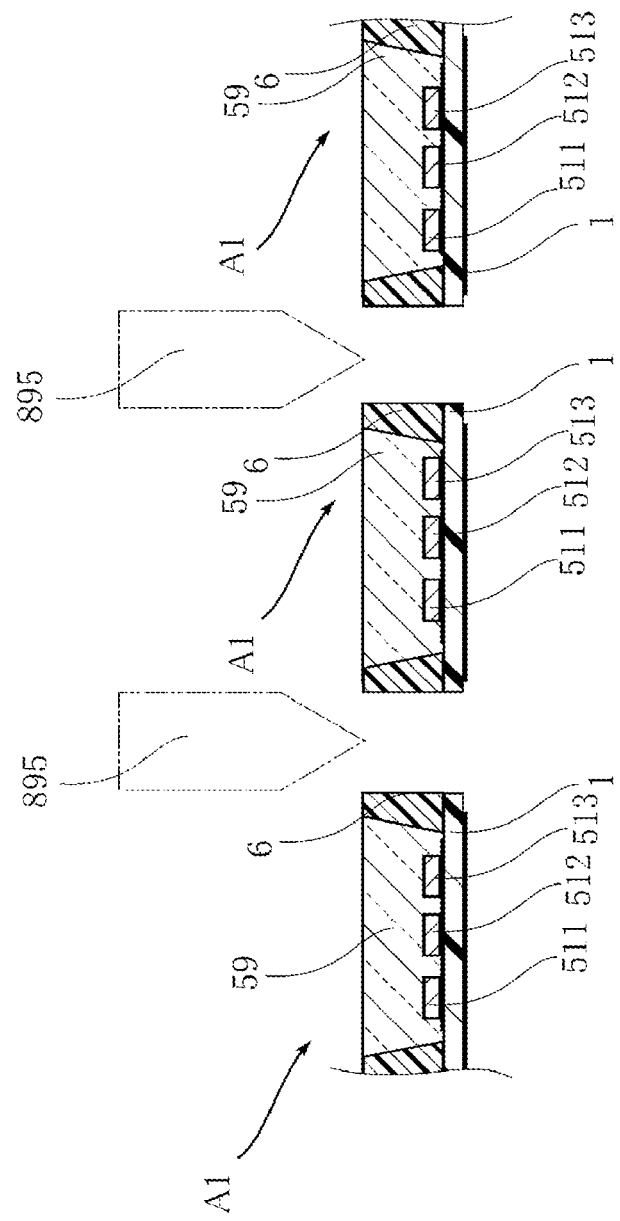
FIG. 13 is a sectional view taken along line XIII-XIII in FIG. 12.

Subsequently, as shown in FIGS. 12 and 13, the sealing resin portion 59 is formed and then the case 6' and the substrate 1' are together diced by means of dicing blades 895. The LED module A1 is completed through the steps set forth above.

Next, description will be made on the operations and effects of the present embodiment.

The LED module A1 includes a plurality of penetration electrodes 31. Each of the penetration electrodes 31 is connected to the main surface electrode 2 and the rear surface electrode 4 and extends through the substrate 1. With this configuration, no electrode for electrically connecting the main surface electrode 2 and the rear surface electrode 4 needs to be formed on the substrate side surface 12 of the substrate 1. For that reason, no extra space for guiding the main surface electrode 2 to the substrate side surface 12 needs to be provided on the main surface 11, which results in the reduction in size of the main surface 11. The reduction in size of the main surface 11 assists in reducing the size of the LED module A1.

Unlike the present embodiment, it can be thought that a junction electrode exposed on the substrate 1 in the direction orthogonal to the thickness direction Z is formed to electrically connect the main surface electrode 2 and the rear surface electrode 4. The junction electrode may be formed in a semicircular groove depressed from the substrate side surface 12. The semicircular groove may be formed by bisecting a circular hole formed in the substrate 1'. The prior art may have a problem in forming two LED modules A1 while reducing the size of the circular hole formed in the substrate F. For example, if the circular hole is formed into a small size, the width of the frame-like portion of the case needs to be reduced. In this case, the cross-sectional area of the resin flow space interposed between the first mold 891 and the second mold 892 becomes smaller, and the resin material cannot spread throughout the space. In view of this, the size of the circular hole needs to be set larger than a specific value. However, if the size of the main surface 11 is reduced while setting the size of the circular hole larger than the specific value, the junction electrode formed in the semicircular hole gets closer to the other junction electrode adjacent thereto. If the junction electrodes get close enough together such that they are adjoining, it is likely that, when mounting the LED module, the junction electrodes will be short-circuited through a solder layer.

On the other hand, since the junction electrode is not formed in the LED module A1, the size of the LED module A1 can be reduced without suffering from the above-described problem.

Figure 14:
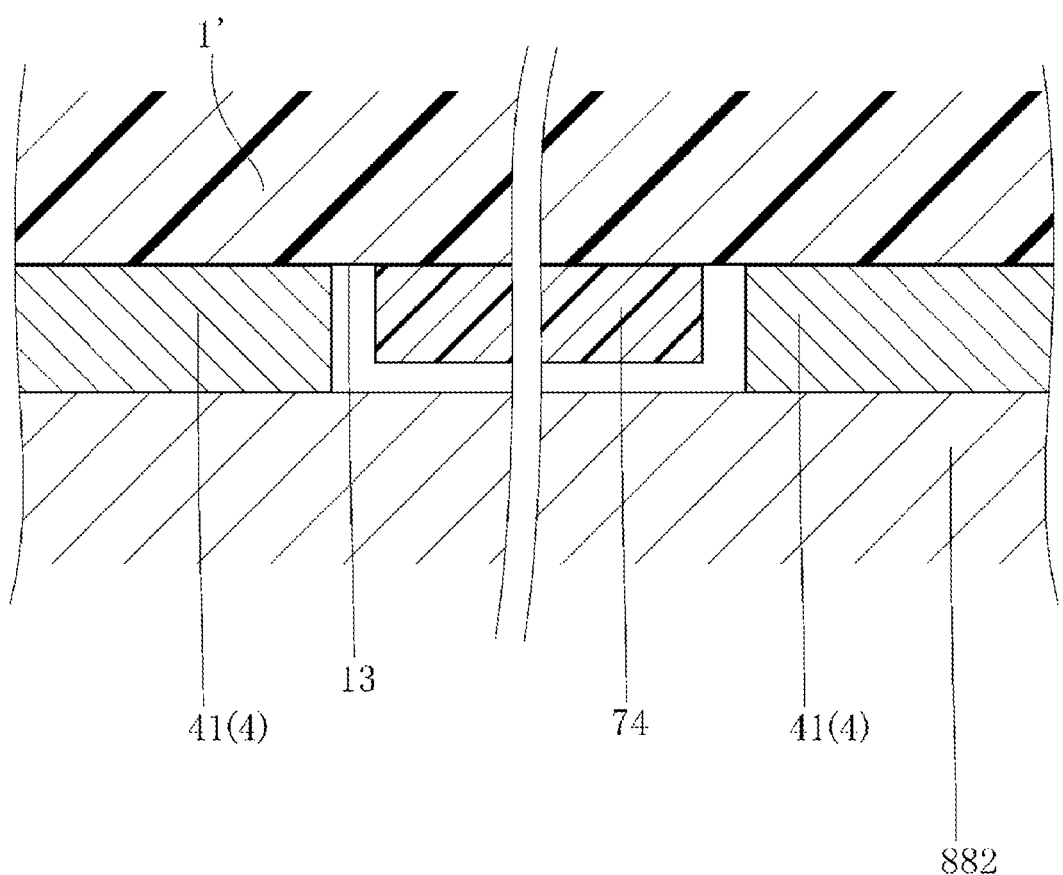
FIG. 14 is a partially-enlarged sectional view showing a vicinity of the rear surface of a substrate during a wire bonding step in the manufacturing process of the LED module of the present disclosure.

In the LED module A1, the end portions of the wires 81 overlap with the rear surface electrode 4 or the insulating film 74 when viewed in the thickness direction (Z direction) of the substrate 1. With this configuration, the rear surface electrode 4 or the insulating film 74 is positioned in the region of the rear surface 13 overlapping with the end portions of the wires 81 when viewed in the Z direction. FIG. 14 is a partially-enlarged sectional view showing a vicinity of the rear surface 13 of the substrate 1' during a step of bonding the wires 81 in the LED module manufacturing process. In the present embodiment, ultrasonic waves flowing through the wires 81 when bonding the wires 81 to the LED chips 511, 512 and 513 or the main surface electrode 2 can efficiently flow toward a stage 882 via the rear surface electrode 4 or the insulating film 74, which results in a reliable bond of the wires 81 to the LED chips 511, 512 and 513 or the main surface electrode 2.

Supposing that the semicircular groove (the circular hole prior to dicing the substrate 1') is formed in the substrate 1, the liquid adhesive agent forming the adhesion layer 71 may be dropped into the circular hole when bonding the case 6' to the substrate F. In the prior art, a recess depressed from the bottom surface 63 is formed in the case 6 in order to prevent the liquid adhesive agent from dropping into the circular hole. In order to form the recess depressed from the bottom surface 63 in the case 6, a mold for forming the recess needs to be prepared, which results in wasted effort and cost. In the present embodiment, however, the hole into which the liquid adhesive agent may drop is not formed in the substrate F. Accordingly, the recess depressed from the bottom surface 63 need not be formed in the case 6. This eliminates the need to perform additional processes on the second mold 892. With the present embodiment, the efforts and costs required in manufacturing the second mold 892 can be reduced. Since the recess depressed from the bottom surface 63 needs not to be formed in the case 6, the case 6 of the LED module A1 can be configured to have the bottom surface 63 extending flat from the surrounding surface 61 to the case side surface 62.

It is assumed that the LED chips 511, 512 and 513 are respectively arranged on individual die pads spaced apart from one another. The individual die pads need to be spaced apart from one another by a distance of, e.g., about 75 μm. Therefore, when the LED chips 511, 512 and 513 are respectively arranged on the individual die pads spaced apart from one another, distances between the individual die pads need to be secured. This makes it difficult to arrange the LED chips 511, 512 and 513 to come to close to one another. In the present embodiment, however, the LED chips 511, 512 and 513 are arranged on the single die pad 241. It is therefore unnecessary to secure distances between die pads, which results in a reduction in distances between the LED chips 511, 512 and 513. The reduction in distances between the LED chips 511, 512 and 513 assists in reducing the size of the LED module A1.

In the LED module A1, the respective wires 81 extend in the directions inclined with respect to the X direction and the Y direction orthogonal to the X direction when viewed in the thickness direction Z of the substrate 1. As compared with a case where the respective wires 81 extend straightforward, this configuration assists in reducing the size of the LED module A1 in the Y direction.

In the LED module A1, the die pad 241 is spaced apart from the wire bonding pad 242 with a gap left therebetween. With this configuration, even if the liquid resin material forming the bonding layers 522 and 523 flows from the die pad 241 toward the wire bonding pad 242 when forming the bonding layers 522 and 523, the liquid resin material can be kept between the die pad 241 and the wire bonding pad 242. Accordingly, the bonding layers 522 and 523 can be prevented from covering the wire bonding pad 242, and the region of the wire bonding pad 242 to be bonded with the wires 81 can be exposed in a reliable manner without being covered by the bonding layers 522 and 523.

A second embodiment of the present disclosure will be described with reference to FIGS. 15 through 18.

Figure 15:
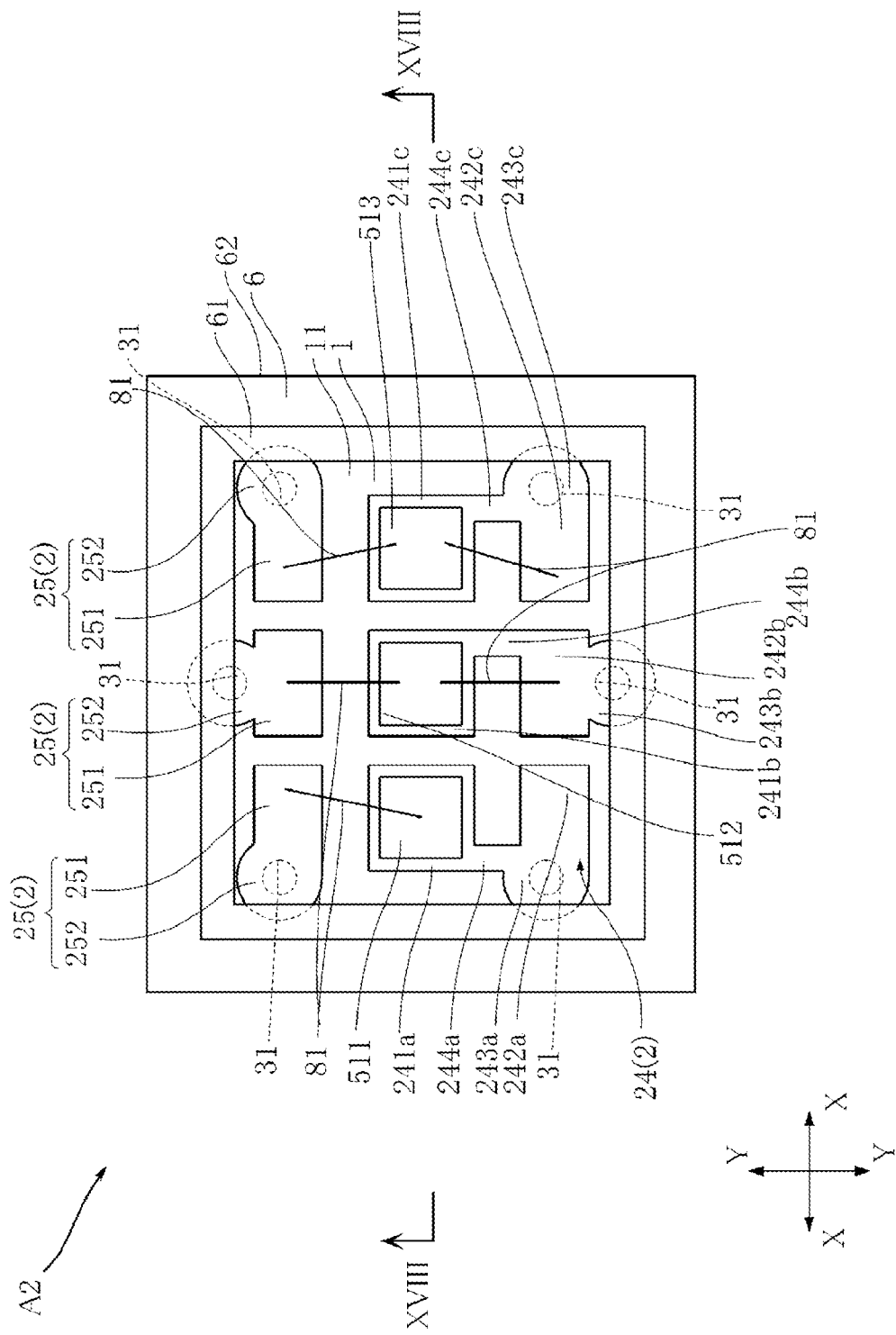
FIG. 15 is a plan view showing an LED module according to a second embodiment of the present disclosure.
Figure 16:
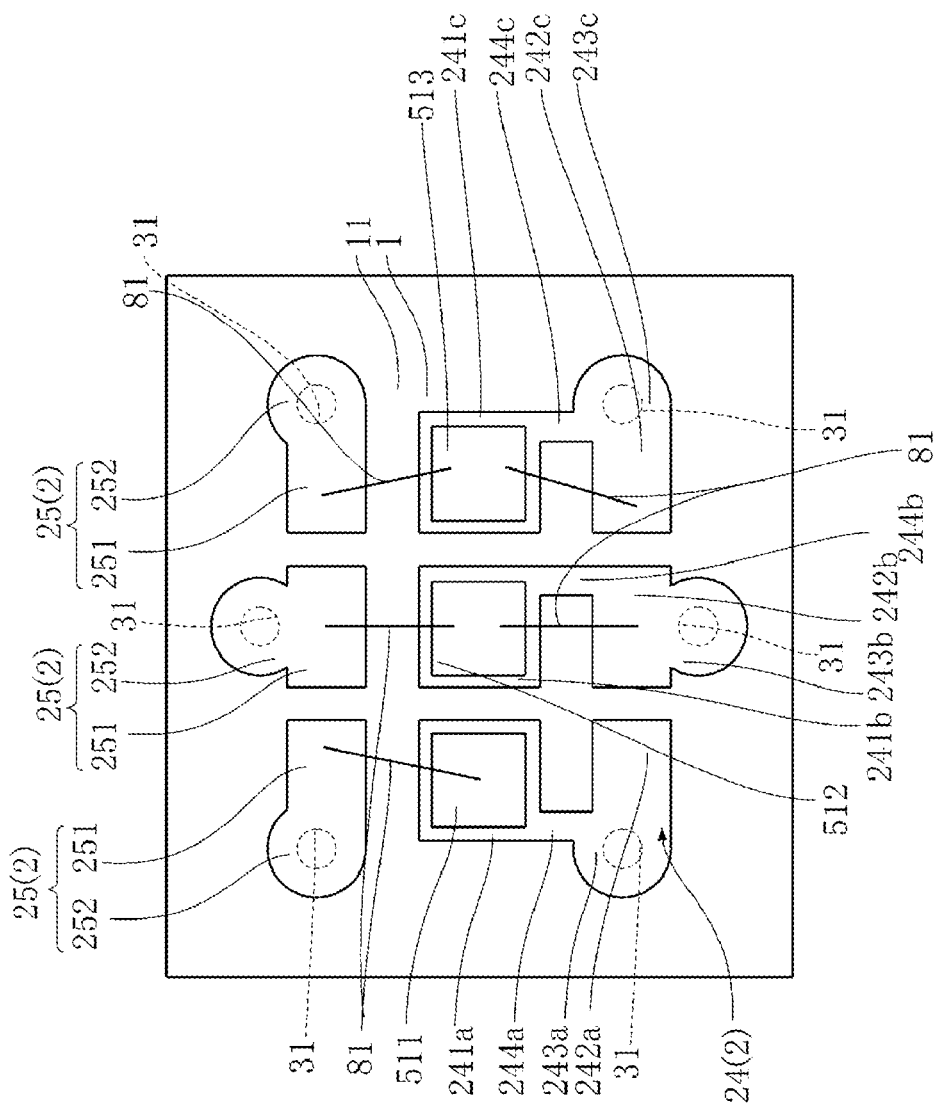
FIG. 16 is a plan view of the LED module of FIG. 15 with a case and an adhesion layer omitted.
Figure 17:
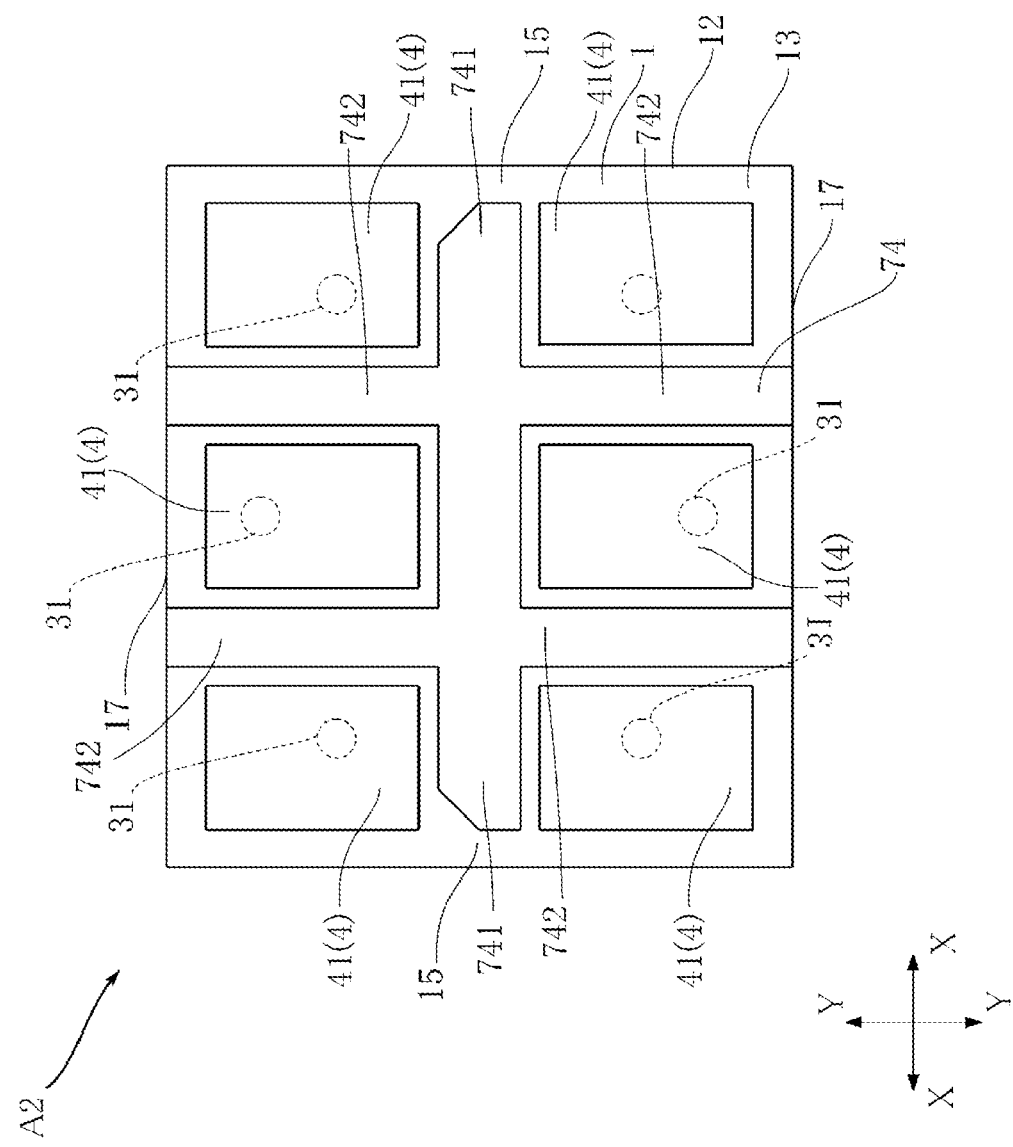
FIG. 17 is a bottom view of the LED module according to the second embodiment of the present disclosure.
Figure 18:
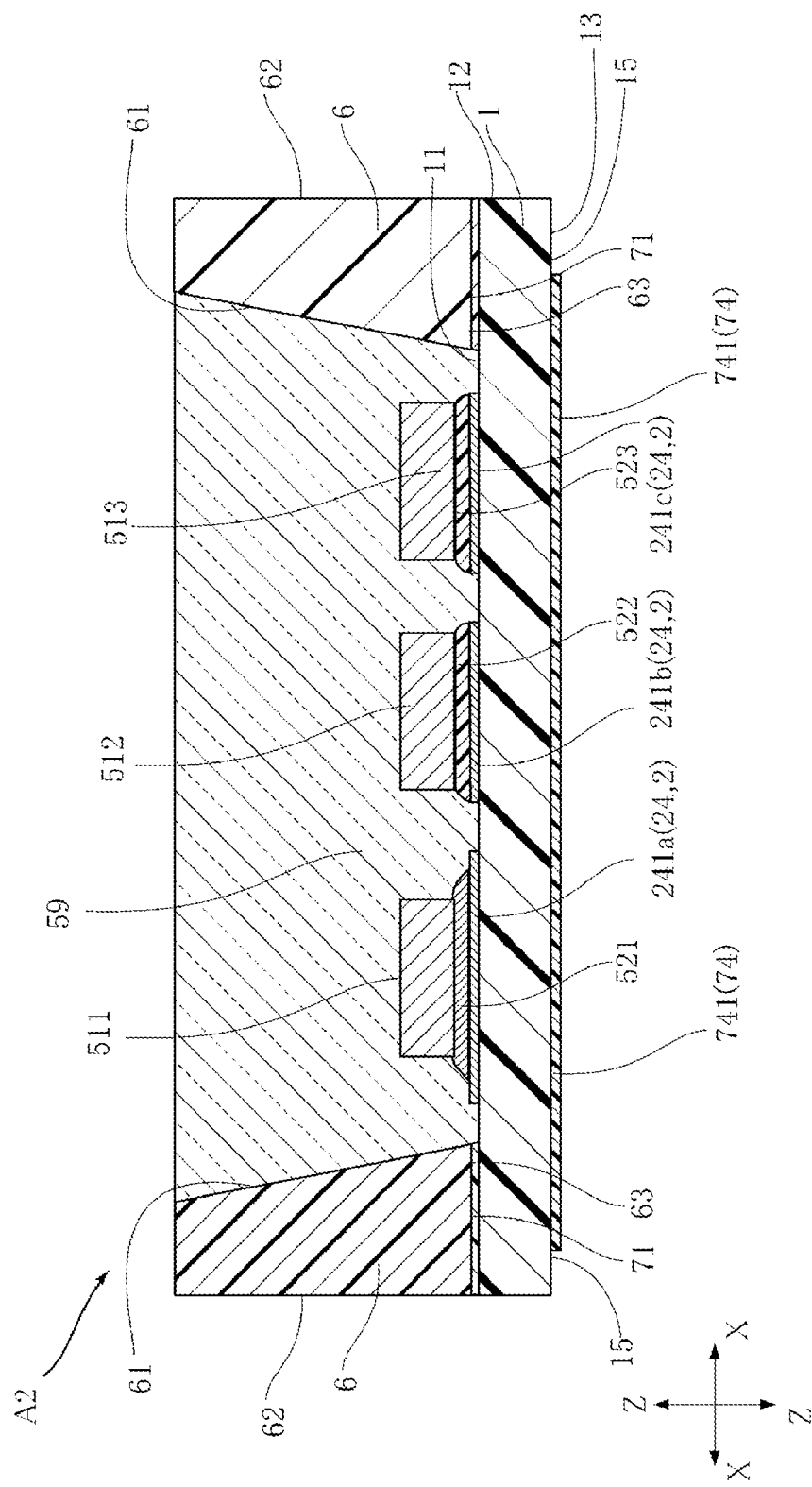
FIG. 18 is a sectional view taken along line XVIII-XVIII in FIG. 15.

FIG. 15 is a plan view showing an LED module according to the second embodiment of the present disclosure. FIG. 16 is a plan view of the LED module of FIG. 15 with a case and an adhesion layer omitted. FIG. 17 is a bottom view of the LED module according to the second embodiment. FIG. 18 is a sectional view taken along line XVIII-XVIII in FIG. 15.

The LED module A2 shown in these figures includes a substrate 1, a main surface electrode 2, a plurality of penetration electrodes 31, a rear surface electrode 4, a plurality of LED chips 511, 512 and 513, a plurality of bonding layers 521, 522 and 523, a sealing resin portion 59, a case 6, an adhesion layer 71, an insulating film 74 and a plurality of wires 81. The configurations of the substrate 1, the LED chips 511, 512 and 513, the bonding layers 521, 522 and 523, the sealing resin portion 59, the case 6, the adhesion layer 71, the insulating film 74 and the wires 81 are the same as those of the LED module A1 described above. Therefore, no description will be made in this regard. In FIG. 15, the sealing resin portion 59 is omitted for the sake of understanding.

The main surface electrode 2 is located on the main surface 11. The main surface electrode 2 includes a first conductive portion 24 and a plurality of second conductive portions 25. The second conductive portions 25 are the same as those of the LED module A1 described above. Therefore, no description will be made in this regard.

At least one of the LED chips 511, 512 and 513 is arranged in the first conductive portion 24. In the present embodiment, the LED chips 511, 512 and 513 are arranged in the first conductive portion 24. The first conductive portion 24 includes a plurality of (three) die pads 241a, 241b and 241c, a plurality of (three) wire bonding pads 242a, 242b and 242c, a plurality of (three) circular pads 243a, 243b and 243c and a plurality of (three) band-like portions 244a, 244b and 244c.

The die pad 241a has a rectangular shape. The LED chip 511 is arranged in the die pad 241a.

The wire bonding pad 242a has a rectangular shape. In the present embodiment, none of the wires 81 is bonded to the wire bonding pad 242a. The die pad 241a is spaced apart from the wire bonding pad 242a with a gap left therebetween. The wire bonding pad 242a is spaced apart from the die pad 241a in the Y direction.

The circular pad 243a has a circular shape when viewed in the Z direction. The circular pad 243a is electrically connected to the die pad 241a and the wire bonding pad 242a.

The band-like portion 244a extends in a band shape along the Y direction. The band-like portion 244a is electrically connected to the die pad 241a. In the present embodiment, the band-like portion 244a is electrically connected to the circular pad 243a. The band-like portion 244a is connected to the die pad 241a and the circular pad 243a.

The die pad 241a, the wire bonding pad 242a, the circular pad 243a and the band-like portion 244a form a single body.

The die pad 241b, the wire bonding pad 242b, the circular pad 243b and the band-like portion 244b are substantially the same as the die pad 241a, the wire bonding pad 242a, the circular pad 243a and the band-like portion 244a, respectively.

The die pad 241b has a rectangular shape. The LED chip 512 is arranged on the die pad 241b.

The wire bonding pad 242b has a rectangular shape. In the present embodiment, one of the wires 81 is bonded to the wire bonding pad 242b. The die pad 241b is spaced apart from the wire bonding pad 242b with a gap left therebetween. The wire bonding pad 242b is spaced apart from the die pad 241b in the Y direction.

The circular pad 243b has a circular shape when viewed in the Z direction. The circular pad 243b is electrically connected to the die pad 241b and the wire bonding pad 242b.

The band-like portion 244b extends in a band shape along the Y direction. The band-like portion 244b is electrically connected to the die pad 241b. In the present embodiment, the band-like portion 244b is electrically connected to the circular pad 243b. The band-like portion 244b is connected to the die pad 241b and the circular pad 243b.

The die pad 241b, the wire bonding pad 242b, the circular pad 243b and the band-like portion 244b form a single body.

The die pad 241c, the wire bonding pad 242c, the circular pad 243c and the band-like portion 244c are substantially the same as the die pad 241a, the wire bonding pad 242a, the circular pad 243a and the band-like portion 244a, respectively.

The die pad 241c has a rectangular shape. The LED chip 513 is arranged on the die pad 241c.

The wire bonding pad 242c has a rectangular shape. In the present embodiment, one of the wires 81 is bonded to the wire bonding pad 242c. The die pad 241c is spaced apart from the wire bonding pad 242c with a gap left therebetween. The wire bonding pad 242c is spaced apart from the die pad 241c in the Y direction.

The circular pad 243c has a circular shape when viewed in the Z direction. The circular pad 243c is electrically connected to the die pad 241c and the wire bonding pad 242c.

The band-like portion 244c extends in a band shape along the Y direction. The band-like portion 244c is electrically connected to the die pad 241c. In the present embodiment, the band-like portion 244c is electrically connected to the circular pad 243c. The band-like portion 244c is connected to the die pad 241c and the circular pad 243c.

The die pad 241c, the wire bonding pad 242c, the circular pad 243c and the band-like portion 244c form a single body.

The die pads 241a, 241b and 241c are spaced apart from one another.

The rear surface electrode 4 is the same as that of the LED module A1 except that the number of the mounting pad portions 41 is six. Therefore, no description will be made on the rear surface electrode 4.

Next, description will be made on the operations and effects of the present embodiment.

Like the LED module A1, the LED module A2 is suitable for size reduction.

In the LED module A2, the end portions of the wires 81 overlap with the rear surface electrode 4 or the insulating film 74 when viewed in the thickness direction Z of the substrate 1. With this configuration, as described above with respect to the LED module A1, it is possible to reliably bond the wires 81.

With the present embodiment, as described above with respect to the LED module A1, the efforts and costs required in manufacturing the second mold 892 can be reduced. Since the recess depressed from the bottom surface 63 need not be formed in the case 6, the case 6 of the LED module A2 can be configured to have the bottom surface 63 extending flat from the surrounding surface 61 to the case side surface 62.

Figure 22:
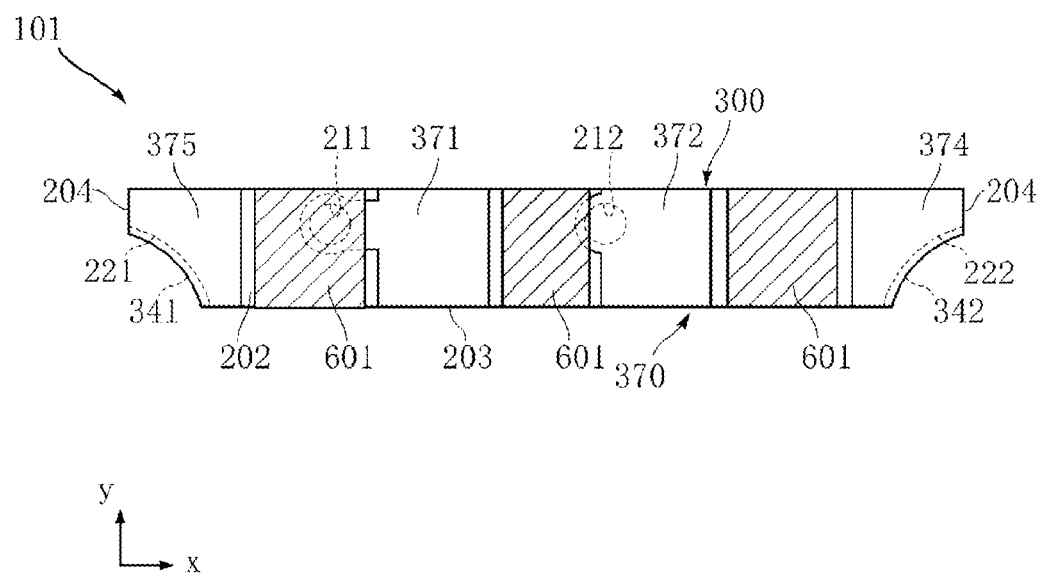
FIG. 22 is a rear view of the LED module shown in FIG. 19.
Figure 23:
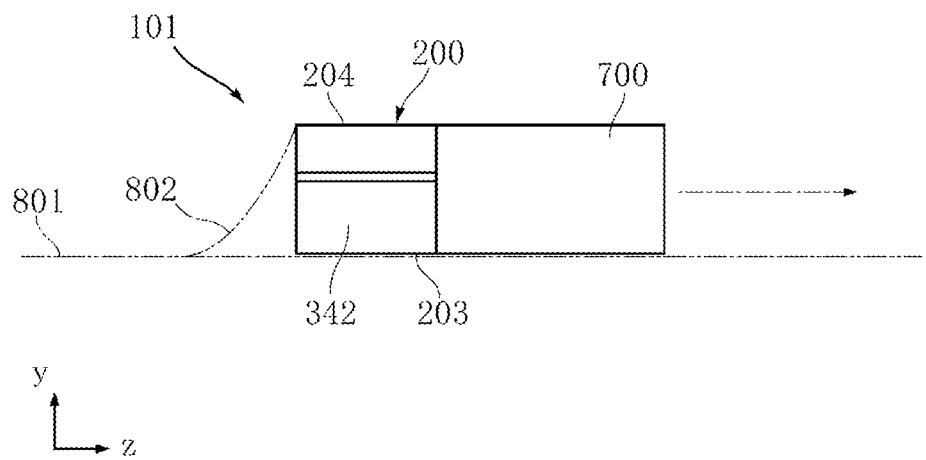
FIG. 23 is a side view of the LED module shown in FIG. 19.

FIGS. 19 through 23 show an LED module according to a first reference example of the present disclosure. The LED module 101 of the present reference example includes a substrate 200, a wiring line 300, three LED chips 401, 402 and 403 and a transparent resin portion 700. The LED module 101 is a so-called side view type LED module mounted to, e.g., a mounting substrate 801 as shown in FIG. 23. In the present reference example, the LED module 101 may have an x-direction dimension of about 3.0 mm, a y-direction dimension of about 0.43 mm and a z-direction dimension of about 1.3 mm.

Figure 19:
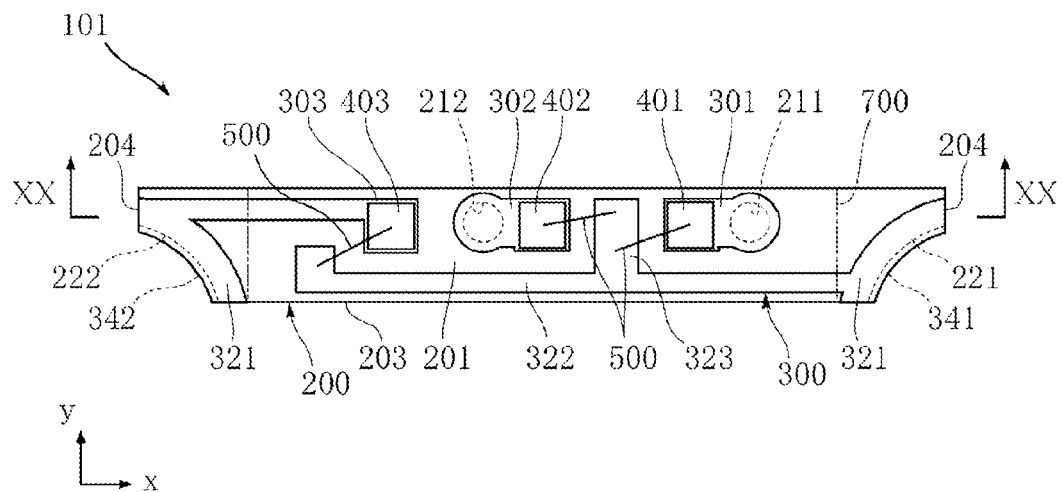
FIG. 19 is a partial front view showing an LED module according to a first reference example of the present disclosure.
Figure 20:
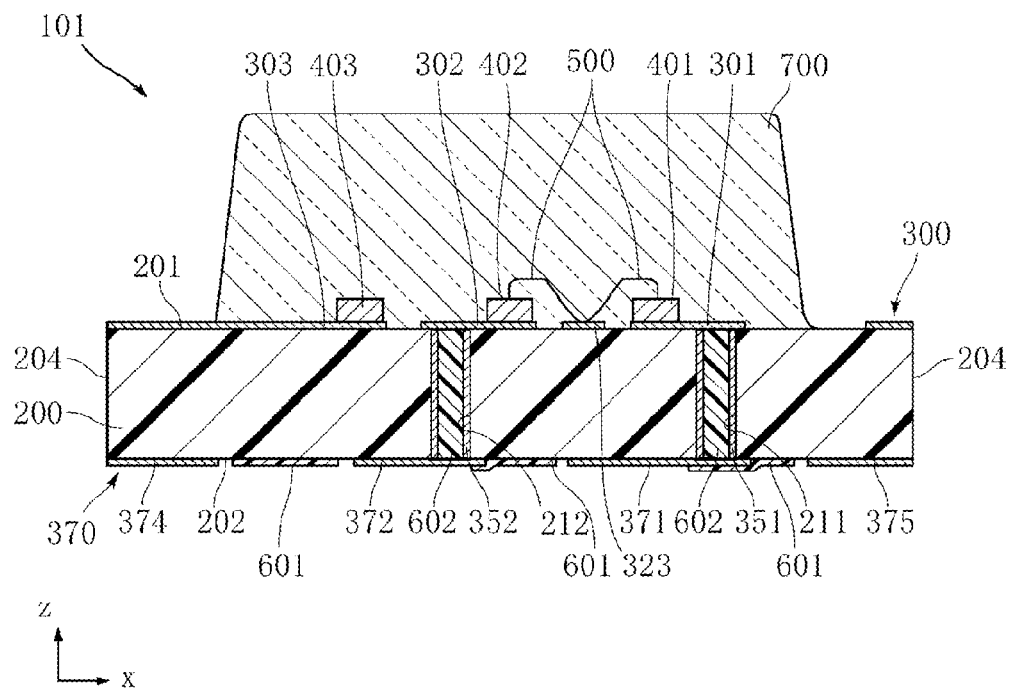
FIG. 20 is a transparent sectional view taken along line XX-XX in FIG. 19.
Figure 21:
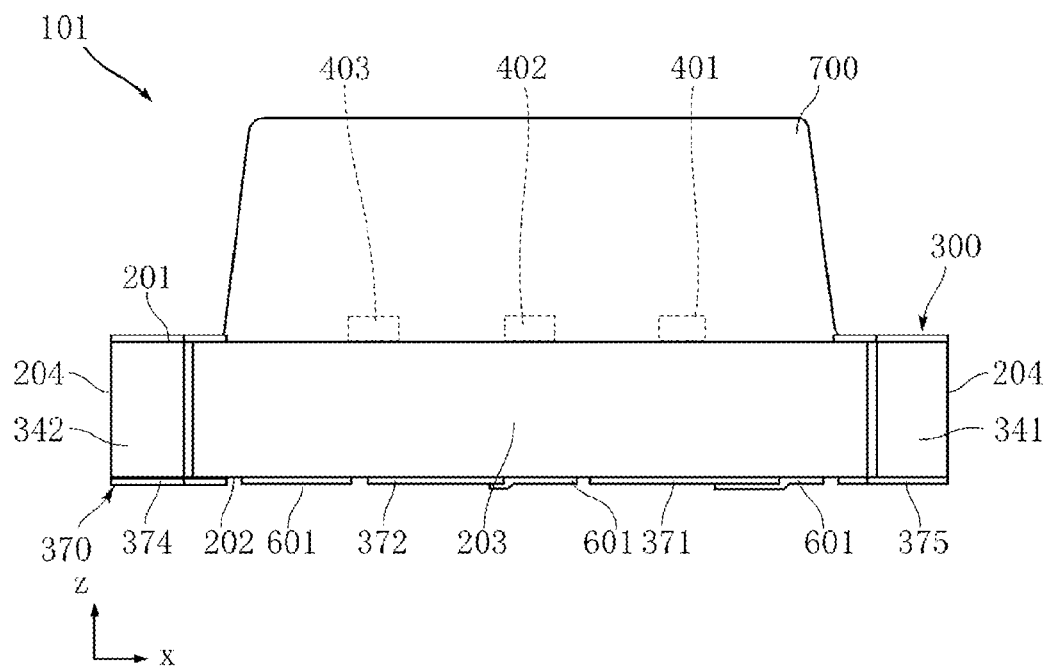
FIG. 21 is a bottom view of the LED module shown in FIG. 19.

The substrate 200 is an insulating substrate made of, e.g., a glass epoxy resin. The substrate 200 has an elongated rectangular shape, the longitudinal direction thereof running in the x-direction, the transverse direction thereof running in the y-direction and the thickness direction thereof running in the z-direction. The substrate 200 includes a main surface 201, a rear surface 202, a bottom surface 203 and two side surfaces 204. A pair of through-holes 211 and 212 and a pair of corner grooves 221 and 222 are formed in the substrate 200. As shown in FIGS. 19 and 22, the through-holes 211 and 212 are arranged closer to the side opposite the bottom surface 203 in the y-direction. In the present reference example, the substrate 200 may have an x-direction dimension of about 3.0 mm, a y-direction dimension of about 0.43 mm and a z-direction dimension of about 0.5 mm.

The through-holes 211 and 212 penetrate through the substrate 200 in the z-direction and extend from the main surface 201 to the rear surface 202. The corner grooves 221 and 222 are disposed between the side surfaces 204 and the bottom surface 203 and extend in the z-direction. Each of the corner grooves 221 and 222 extends from the main surface 201 to the rear surface 202 and has a quarter-circular cross section.

The wiring line 300 serves as an electric power supply path to the three LED chips 401, 402 and 403. The wiring line 300 includes die bonding pads 301, 302 and 303, two quarter-circular arc portions 321, a main surface junction wiring line 322, a branch wiring line 323, corner groove wiring lines 341 and 342, penetration electrodes 351 and 352 and a rear surface electrode 370. The wiring line 300 has a structure formed by, e.g., laminating a Cu layer, a Ni layer and an Au layer one above another.

The die bonding pads 301, 302 and 303 are arranged along the x-direction. The LED chips 401, 402 and 403 are die-bonded to the die bonding pads 301, 302 and 303. Each of the die bonding pads 301 and 302 is formed by combining a square portion and a circular portion. The circular portions of the die bonding pads 301 and 302 are arranged opposite each other in the x-direction. The die bonding pad 303 includes a square portion and a band-like portion extending from the square portion in the x-direction.

The quarter-circular arc portions 321 are formed near the regions of the main surface 201 connected to the corner grooves 221 and 222. The main surface junction wiring line 322 extends in a band shape along the x-direction from the quarter-circular arc portion 321 formed near the corner groove 221. The main surface junction wiring line 322 is arranged near one end of the main surface 201 in the y-direction. The branch wiring line 323 extends in the y-direction from the main surface junction wiring line 322 between the die bonding pads 301 and 302.

The corner groove wiring lines 341 and 342 are formed to cover the inner surfaces of the corner grooves 221 and 222 of the substrate 200. The corner groove wiring lines 341 and 342 extend from the main surface 201 to the rear surface 202. The penetration electrodes 351 and 352 are formed in a cylindrical shape on the inner surfaces of the through-holes 211 and 212. The penetration electrodes 351 and 352 extend from the main surface 201 to the rear surface 202. In the present reference example, filler resins 602 are filled into the penetration electrodes 351 and 352.

The rear surface electrode 370 is formed on the rear surface 202. In the present reference example, the rear surface electrode 370 includes intermediate individual electrodes 371 and 372, an end portion individual electrode 374 and an end portion common electrode 375. The intermediate individual electrodes 371 and 372, the end portion individual electrode 374 and the end portion common electrode 375 are arranged side by side along the x-direction. The intermediate individual electrodes 371 and 372 are interposed between the end portion individual electrode 374 and the end portion common electrode 375. The intermediate individual electrode 371 overlaps with the through-hole 211 when viewed in the z-direction. The intermediate individual electrode 371 is connected to the penetration electrode 351. The intermediate individual electrode 372 overlaps with the through-hole 212 when viewed in the z-direction. The intermediate individual electrode 372 is connected to the penetration electrode 352. The end portion individual electrode 374 is arranged near one end of the rear surface 202 in the x-direction and connected to the corner groove wiring line 342. The end portion common electrode 375 is arranged near the other end of the rear surface 202 in the x-direction and connected to the corner groove wiring line 341.

In the present reference example, a plurality of insulating films 601 is formed on the rear surface 202. The insulating films 601 are arranged to cover the portion of the rear surface 202 exposed from the rear surface electrode 370 and some portions of the intermediate individual electrodes 371 and 372. The wiring line 300 is not formed on the bottom surface 203. Thus the entire bottom surface 203 may be exposed. When mounting the LED module 101 to the mounting substrate 801 shown in FIG. 23, a solder fillet 802 is formed which makes contact with the pad (not shown) of the mounting substrate 801 and the intermediate individual electrodes 371 and 372. The end portion individual electrode 374 and the end portion common electrode 375 are arranged such that a portion of the solder fillet 802 fills a space surrounded by the end portion individual electrode 374 or the end portion common electrode 375 and the mounting substrate 801.

The LED chips 401, 402 and 403 are light sources of the LED module 101. Each of the LED chips 401, 402 and 403 has a structure in which a p-type semiconductor layer, an n-type semiconductor layer and an active layer interposed between the p-type semiconductor layer and the n-type semiconductor layer are laminated one above another. The LED chip 401 is die-bonded to the die bonding pad 301 and configured to emit, e.g., blue light. The LED chip 402 is die-bonded to the die bonding pad 302 and configured to emit, e.g., red light. The LED chip 403 is die-bonded to the die bonding pad 303 and configured to emit, e.g., green light. The LED chips 401 and 402 are connected to the branch wiring line 323 by wires 500. The LED chip 403 is connected to the main surface junction wiring line 322 by a wire 500. The distances between the LED chips 401, 402 and 403 may range from 100 μm to 150 μm.

The intermediate individual electrode 371 is electrically connected to the LED chip 401 through the penetration electrode 351. The intermediate individual electrode 372 is electrically connected to the LED chip 402 through the penetration electrode 352. The end individual electrode 374 is electrically connected to the LED chip 403 through the corner groove wiring line 342. The end common electrode 375 is electrically connected to the LED chips 401, 402 and 403 through the corner groove wiring line 341.

The transparent resin portion 700 is formed on the main surface 201 of the substrate 200 to cover the LED chips 401, 402 and 403. The transparent resin portion 700 is made of a transparent resin, e.g., an epoxy resin, or a resin that can transmit the light emitted from the LED chips 401, 402 and 403. In the present reference example, the transparent resin portion 700 has a trapezoidal shape when viewed in the y-direction and a rectangular shape when viewed in the x-direction. The transparent resin portion 700 has a z-direction dimension of, e.g., about 0.8 mm.

Next, description will be made on the operations of the LED module 101.

With the present reference example, the paths extending from the intermediate individual electrodes 371 and 372 through the penetration electrodes 351 and 352 are used as electric power supply paths to the LED chips 401 and 402. These paths do not have portions extending from the main surface 201 or the rear surface 202 to the bottom surface 203. Accordingly, the space on the main surface 201 and the rear surface 202 necessary to form the wiring line 300 can be reduced and thus the size of the LED module 101 can be reduced.

The paths extending from the end portion individual electrode 374 and the end portion common electrode 375 through the corner groove wiring lines 341 and 342 are used as electric power supply paths to the LED chips 401, 402 and 403. With this configuration, the bottom surface 203 is not covered with the wiring line 300 at all. In other words, portions through which the wiring line 300 extends from the main surface 201 or the rear surface 202 to the bottom surface 203 need not be provided. Accordingly, the space on the main surface 201 and the rear surface 202 necessary to form the wiring line 300 can be further reduced.

As shown in FIG. 22, the through-holes 211 and 212 are formed at the side spaced apart from the bottom surface 203 in the y-direction. Therefore, even if the intermediate individual electrodes 371 and 372 are unintentionally deformed due to the existence of the through-holes 211 and 212, the mounting posture of the LED module 101 shown in FIG. 23 can be prevented from being disturbed by the deformation.

In FIGS. 24 to 31, components identical with or similar to those of the above-described reference example will be designated by like reference symbols.

Figure 24:
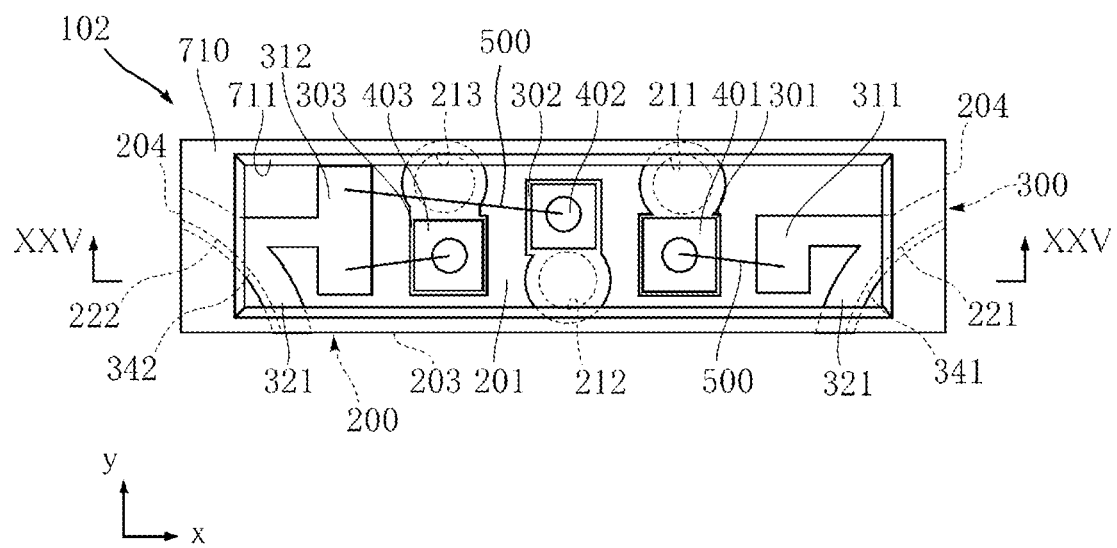
FIG. 24 is a partial front view showing an LED module according to a second reference example of the present disclosure.
Figure 25:
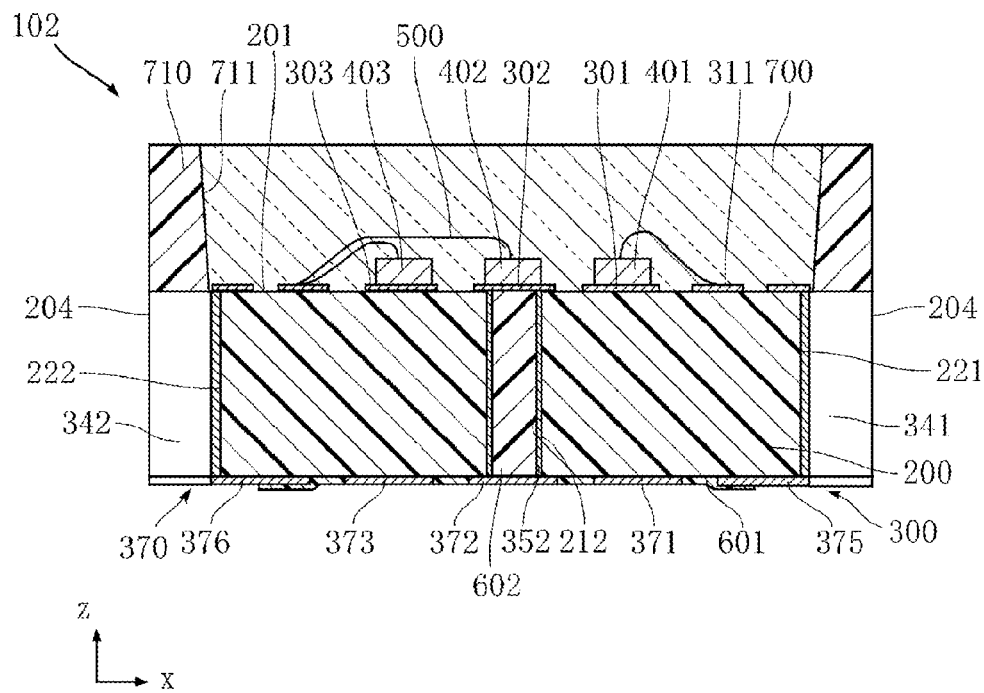
FIG. 25 is a transparent sectional view taken along line XXV-XXV in FIG. 24.
Figure 26:
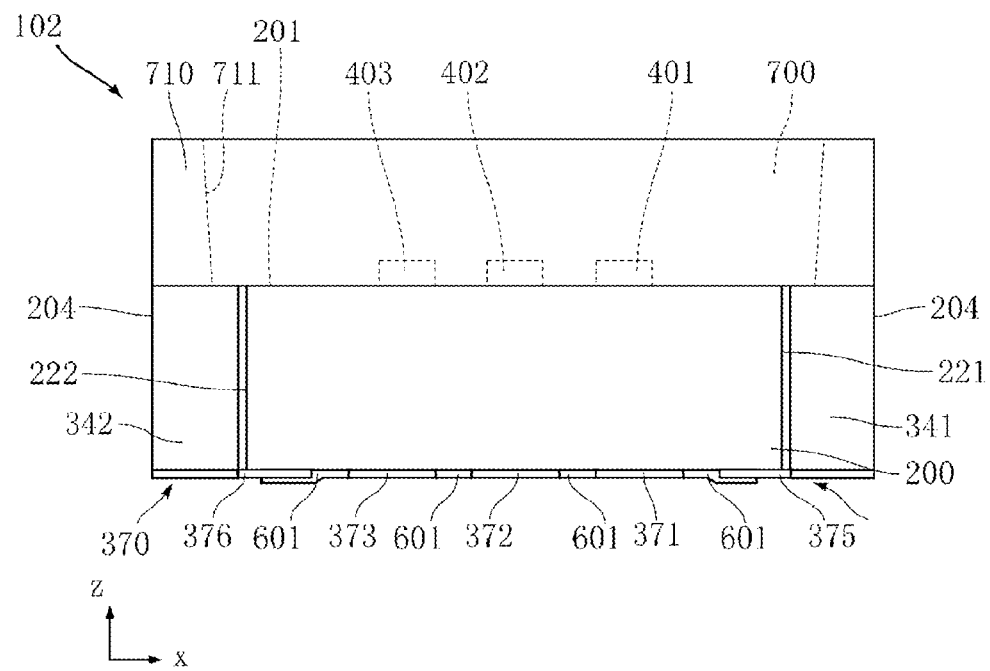
FIG. 26 is a bottom view of the LED module shown in FIG. 24.
Figure 27:
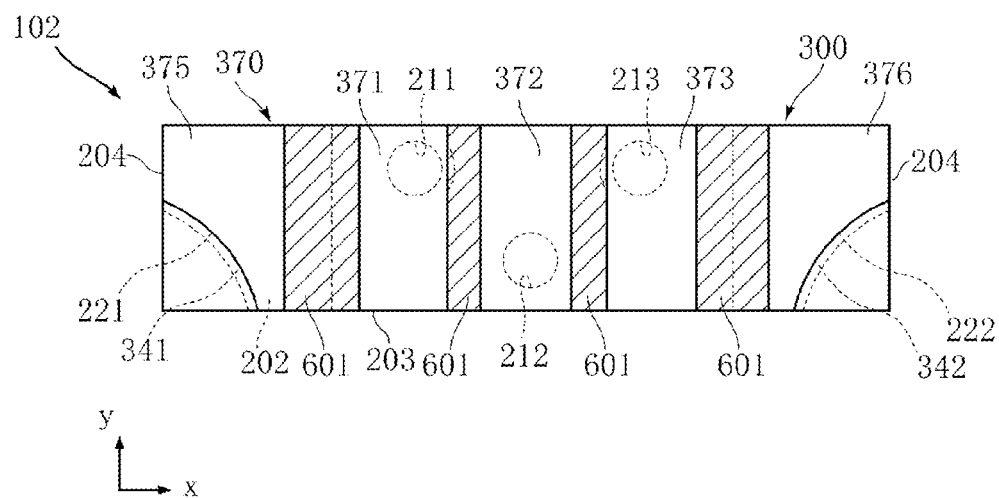
FIG. 27 is a rear view of the LED module shown in FIG. 24.

FIGS. 24 to 27 show an LED module according to a second reference example of the present disclosure. The LED module 102 of the present reference example includes three through-holes 211, 212 and 213, three individual electrodes 371, 372 and 373 and two end portion common electrodes 375 and 376. The LED module 102 further includes a reflector 710. The LED module 102 has an x-direction dimension of about 2.0 mm, a y-direction dimension of about 0.5 mm and a z-direction dimension of about 0.9 mm. In FIG. 24, the transparent resin portion 700 is omitted for the sake of understanding.

The three through-holes 211, 212 and 213 are formed in the substrate 200. Penetration electrodes 351, 352 and 353 (the penetration electrodes 351 and 353 are not shown) are formed on the inner surfaces of the through-holes 211, 212 and 213, respectively. The individual electrodes 371, 372 and 373 are connected to the penetration electrodes 351, 352 and 353, respectively. Three die bonding pads 301, 302 and 303 are formed on the main surface 201. Three LED chips 401, 402 and 403 are die-bonded to the die bonding pads 301, 302 and 303, respectively, and electrically connected to the penetration electrodes 351, 352 and 353, respectively. The through-holes 211 and 213 (the penetration electrodes 351 and 353) are respectively arranged at the upper side of the LED chips 401 and 403 in FIG. 24. The through-hole 212 (the penetration electrode 352) is arranged at the lower side of the LED chip 402 in FIG. 24.

Two bonding pads 311 and 312 are formed on the main surface 201. The bonding pad 311 and the LED chip 401 are connected by a wire 500. The bonding pad 312 and the LED chips 402 and 403 are connected by wires 500. The bonding pad 311 is connected to one of the quarter-circular arc portions 321 and electrically connected to the end portion common electrode 375 through the corner groove wiring line 341. The bonding pad 312 is connected to the other quarter-circular arc portion 321 and electrically connected to the end portion common electrode 376 through the corner groove wiring line 342.

The reflector 710 is made of, e.g., a white resin, and formed on the main surface 201. The reflector 710 includes a reflecting surface 711. The reflecting surface 711 surrounds the LED chips 401, 402 and 403 and serves to reflect the light emitted from the LED chips 401, 402 and 403 in the x-direction or y-direction toward the z-direction. The reflector 710 may have a z-direction dimension of, e.g., about 0.4 mm. The region surrounded by the reflector 710 is filled with the transparent resin portion 700.

With the present reference example, the size of the LED module 102 can be reduced. In particular, by arranging the LED chips 401, 402 and 403 and the through-holes 211, 212 and 213 in a so-called zigzag pattern, the x-direction dimension of the substrate 200 can be reduced.

Figure 28:
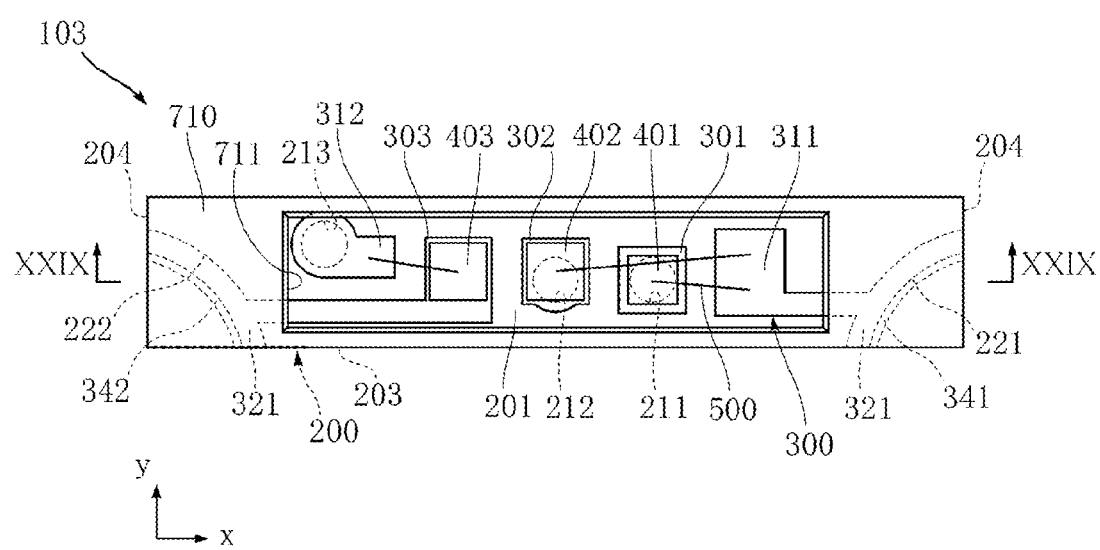
FIG. 28 is a partial front view showing an LED module according to a third embodiment of the present disclosure.
Figure 29:
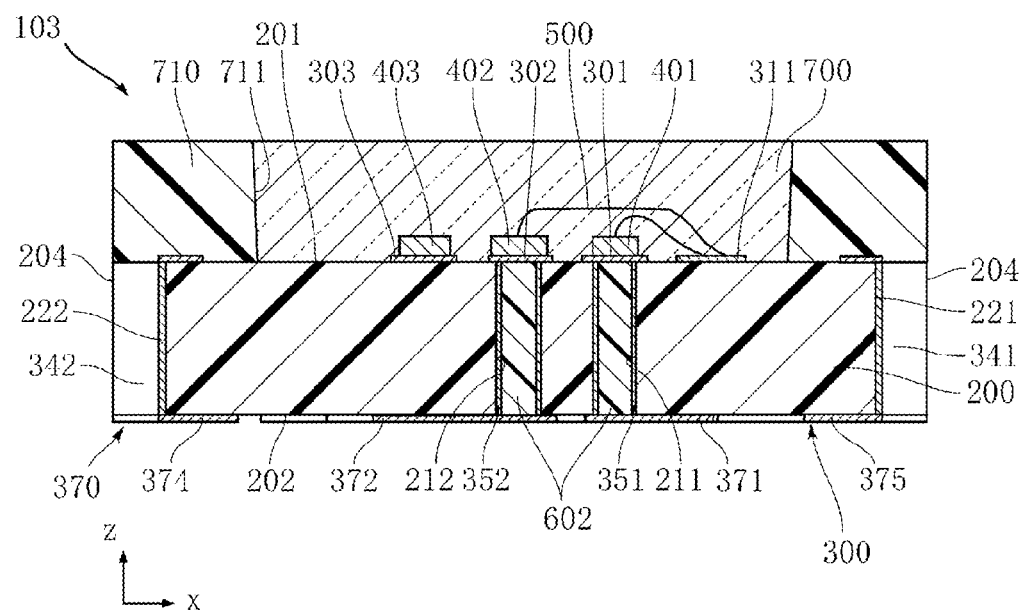
FIG. 29 is a transparent sectional view taken along line XXIX-XXIX in FIG. 28.
Figure 30:
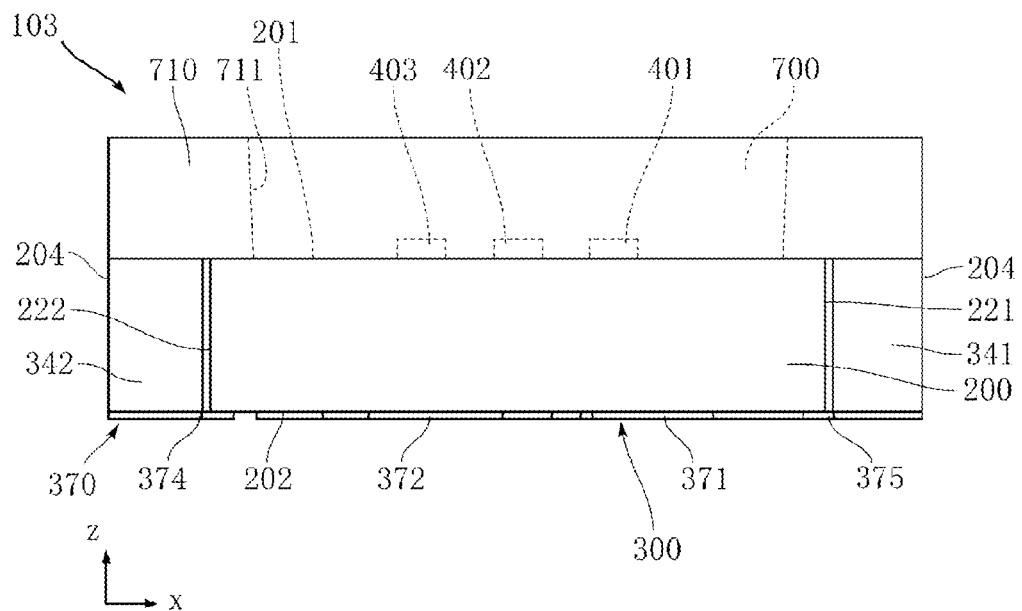
FIG. 30 is a bottom view of the LED module shown in FIG. 28.
Figure 31:
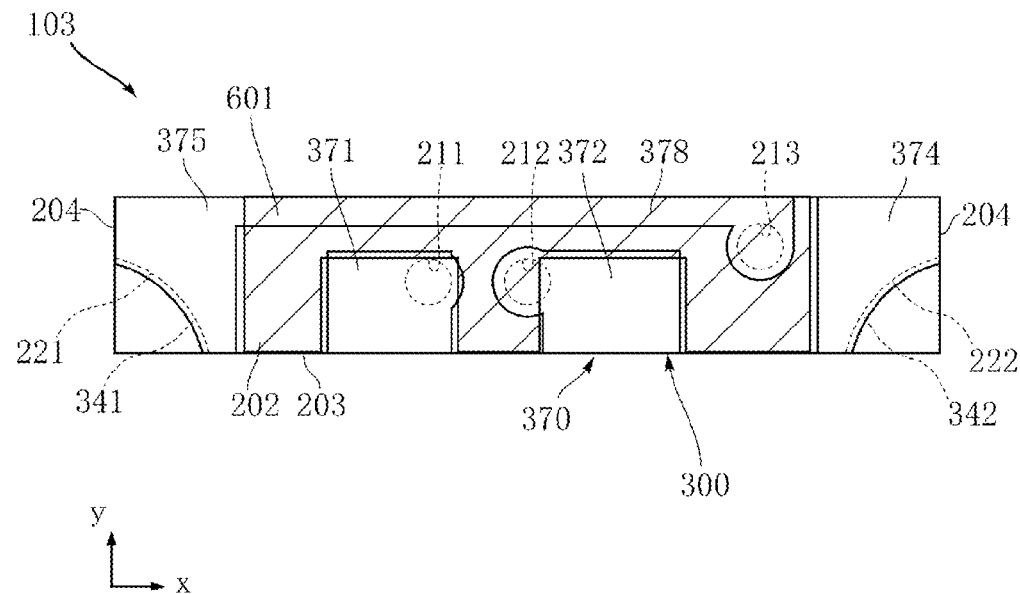
FIG. 31 is a rear view of the LED module shown in FIG. 28.
Figure 32:
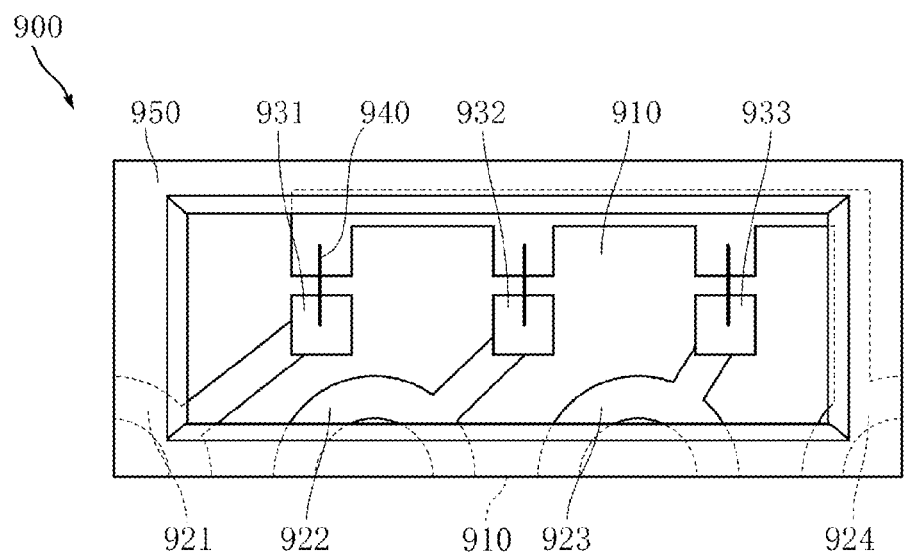
FIG. 32 is a partial front view showing one example of a conventional LED module.

FIGS. 28 to 31 show an LED module according to a third embodiment of the present disclosure. The LED module 103 of the present embodiment differs from the above-described LED module 102 in terms of the configuration of the wiring line 300 on the main surface 201 and the rear surface 202. The LED module 103 has an x-direction dimension of about 2.7 mm, a y-direction dimension of about 0.5 mm and a z-direction dimension of about 0.9 mm. In FIG. 28, the transparent resin portion 700 is omitted for the sake of understanding. In FIG. 31, the region where the insulating film 601 is formed is hatched.

In the present embodiment, the die bonding pad 303 is connected to the quarter-circular arc portions 321. The quarter circular arc portions 321 are connected to the corner groove wiring line 342. The rear surface electrode 370 includes an end portion individual electrode 374. The end portion individual electrode 374 is connected to the corner groove wiring line 342. The bonding pad 312 connected to the LED chip 403 by the wire 500 is connected to the penetration electrode 353 (not shown) formed in the through-hole 213. The rear surface electrode 370 includes a rear surface junction wiring line 378. The rear surface junction wiring line 378 interconnects the penetration electrode 353 and the end portion common electrode 375. On the main surface 201, the bonding pad 311 and the LED chips 401 and 402 are connected by the wires 500. The bonding pad 311 is electrically connected to the end portion common electrode 375 through the corner groove wiring line 341. Thus the end portion common electrode 375 is electrically connected not only to the LED chips 401 and 402 but also to the LED chip 403. The through-holes 211 and 212 overlap with the LED chips 401 and 402 when viewed in the z-direction.

The wire 500 interconnecting the LED chip 402 and the bonding pad 311 has a portion overlapping with the LED chip 401 when viewed in the z-direction. The center of the LED chip 401 is misaligned with the center of the LED chip 402 in the y-direction. When viewed in the z-direction, the through-hole 212 includes a portion overlapping with the LED chip 402 and a portion protruding from the LED chip 402.

The insulating film 601 is arranged to cover the rear surface electrode 370. More specifically, the insulating film 601 covers the rear surface junction wiring line 378. The insulating film 601 at least partially exposes the individual electrodes 371 and 372. The insulating film 601 covers the portions of the individual electrodes 371 and 372 adjoining the rear surface junction wiring line 378. Accordingly, the insulating film 601 can be prevented from being rolled up. The insulating film 601 exposes both the end portion individual electrode 374 and the end portion common electrode 375.

With the present embodiment, the size of the LED module 103 can be reduced. In particular, by allowing the through-holes 211 and 212 to overlap with the LED chips 401 and 402 when viewed in the z-direction, the size of the substrate 200, i.e., the size of the LED module 103, can be further reduced.

In the LED module 103, the wire 500 interconnecting the LED chip 402 and the bonding pad 311 has a portion overlapping with the LED chip 401 when viewed in the z-direction. With this configuration, the wire 500 can be bonded to the LED chip 402 and the bonding pad 311 which are arranged at opposite sides of the LED chip 401. That is to say, no bonding pad for bonding the wire 500 connected to the LED chip 402 needs to be provided between the LED chip 402 and the LED chip 401 or between the LED chip 402 and the LED chip 403. Accordingly, the distance between the LED chip 402 and the LED chip 401 or the distance between the LED chip 402 and the LED chip 403 can be reduced.

In the LED module 103, the center of the LED chip 401 is misaligned with the center of the LED chip 402 in the y-direction. This helps prevent the wire 500 connected to the LED chip 401 and the wire 500 connected to the LED chip 402 from making contact with each other. In addition, this helps prevent a capillary tube used when forming one of the wires 500 from making contact with another of the wires 500.

In the LED module 103, the through-hole 212 includes, when viewed in the z-direction, a portion overlapping with the LED chip 402 and a portion protruding from the LED chip 402. With this configuration, the distance between the individual electrode 372 overlapping with the through-hole 212 and the rear surface junction wiring line 378 can be secured.

In the LED module 103, the insulating film 601 is arranged to cover the rear surface junction wiring line 378. With this configuration, the solder making contact with the individual electrodes 371 and 372 can be prevented from adhering to the rear surface junction wiring line 378. Accordingly, a problem in that the individual electrodes 371 and 372 are short-circuited to the rear surface junction wiring line 378 through the solder can be prevented.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED (Light Emitting Diode) module, comprising:
   a substrate including a main surface and a rear surface located opposite the main surface;
   a main surface electrode located on the main surface;
   a rear surface electrode located on the rear surface and including a plurality of mutually spaced-apart mounting pad portions;
   a plurality of penetration electrodes connecting the main surface electrode and the rear surface electrode, and extending through the substrate;
   three or more LED chips arranged on the main surface electrode along a first direction;
   a case arranged on the main surface to surround the main surface electrode; and
   an insulating film formed on the rear surface, and including a first band-like insulating portion extending in an elongated shape and a second band-like insulating portion extending in an elongated shape along a direction intersecting the extension direction of the first band-like insulating portion, the first band-like insulating portion located between two of the mounting pad portions and the second band-like insulating portion located between two of the mounting pad portions, both ends of the first band-like portion extending to a position which is a certain distance apart from a peripheral end of the rear surface,
   wherein the LED chips include at least one LED chip that can emit red light, at least one LED chip that can emit green light and at least one LED chip that can emit blue light.

2. The LED module of claim 1, wherein the main surface electrode has a portion located between the main surface and the case.

3. The LED module of claim 2, further comprising:
   a plurality of wires, each of the wires being bonded to one of the LED chips and the main surface electrode.

4. The LED module of claim 3, wherein the main surface electrode includes a first conductive portion and a plurality of second conductive portions insulated from the first conductive portion, and at least one of the LED chips is arranged on the first conductive portion.

5. The LED module of claim 4, wherein the first conductive portion includes a first die pad and a first wire bonding pad electrically connected to the first die pad, the first die pad and the first wire bonding pad being spaced apart from each other with a gap left therebetween, and wherein at least one of the LED chips is arranged on the first die pad and at least one of the wires is bonded to the first wire bonding pad.

6. The LED module of claim 5, wherein the first wire bonding pad is spaced apart from the first die pad in a second direction intersecting the first direction.

7. The LED module of claim 6, wherein the first die pad is positioned between the second conductive portions and the first wire bonding pad.

8. The LED module of claim 5, wherein the first conductive portion includes a first circular pad electrically connected to the first wire bonding pad and overlapping with one of the penetration electrodes when viewed in a thickness direction of the substrate.

9. The LED module of claim 8, wherein the first circular pad has a portion located between the case and the substrate.

10. The LED module of claim 5, wherein the first conductive portion includes a band-like portion electrically connected to the first die pad.

11. The LED module of claim 5, wherein each of the second conductive portions includes a wire bonding wiring section to which one of the wires is bonded.

12. The LED module of claim 11, wherein one of the wires is bonded to each of the second conductive portions.

13. The LED module of claim 11, wherein each of the second conductive portions includes a circular wiring section electrically connected to the wire bonding wiring section and overlapping with one of the penetration electrodes when viewed in a thickness direction of the substrate.

14. The LED module of claim 13, wherein the circular wiring section is connected to the wire bonding wiring section.

15. The LED module of claim 13, wherein the circular wiring section has a portion located between the case and the substrate.

16. The LED module of claim 5, wherein the LED chips are arranged on the first die pad.

17. The LED module of claim 16, wherein, when viewed in a thickness direction of the substrate, at least one of the wires extends in a direction inclined with respect to the first direction and a direction orthogonal to the first direction.

18. The LED module of claim 5, wherein the first conductive portion includes a second die pad spaced apart from the first die pad and a third die pad spaced apart from the first die pad and the second die pad, and wherein only one of the LED chips is arranged on each of the first to the third die pad.

19. The LED module of claim 2, further comprising:
   a plurality of bonding layers located between each of the LED chips and the main surface electrode.

20. The LED module of claim 19, wherein at least one of the bonding layers is electrically conductive.

21. The LED module of claim 19, wherein at least one of the bonding layers has an insulation property.

22. The LED module of claim 2, further comprising:
   an adhesion layer located between the case and the substrate.

23. The LED module of claim 2, wherein one of the penetration electrodes overlaps with the case when viewed in a thickness direction of the substrate.

24. The LED module of claim 2, wherein the case has a surrounding surface surrounding the LED chips.

25. The LED module of claim 24, wherein the case has a case side surface located opposite a region surrounded by the surrounding surface.

26. The LED module of claim 25, wherein the substrate has a substrate side surface flush with the case side surface.

27. The LED module of claim 25, wherein the case has a bottom surface facing the main surface and connected to the surrounding surface and the case side surface.

28. The LED module of claim 27, wherein the bottom surface has a frame-like shape and extends flat from the surrounding surface to the case side surface.

29. The LED module of claim 24, wherein the surrounding surface is inclined with respect to a thickness direction of the substrate such that the surrounding surface makes an acute angle with the bottom surface.

30. The LED module of claim 1, wherein the wires have end portions overlapping with the rear surface electrode or the insulating film when viewed in a thickness direction of the substrate.

31. The LED module of claim 30, wherein, when viewed in the thickness direction of the substrate, the insulating film is formed in a region of the rear surface other than a region where the rear surface electrode is formed.

32. The LED module of claim 1, wherein the rear surface includes an exposed portion exposed from the insulating film, the exposed portion being positioned in a marginal area of the rear surface along an extension direction of the first band-like insulating portion and the first band-like insulating portion being contiguous to the exposed portion when viewed in the thickness direction of the substrate.

33. The LED module of claim 1, wherein the second band-like insulating portion reaches a peripheral end of the rear surface.

34. An LED (Light Emitting Diode) module mounting structure, comprising:
the LED module of claim 1;
a mounting substrate; and
a solder layer located between the mounting substrate and the rear surface.

35. An LED (Light Emitting Diode) module, comprising:
a substrate having a main surface and a rear surface opposite to the main surface;
a main surface electrode formed on the main surface;
a rear surface electrode located on the rear surface and including a plurality of mutually spaced-apart mounting pad portions;
a plurality of penetration electrodes connecting the main surface electrode and the rear surface electrode, and extending through the substrate;
a plurality of LED chips arranged on the main surface electrode along one direction; and
an insulating film formed on the rear surface, and including a first band-like insulating portion extending in an elongated shape and a second band-like insulating portion extending in an elongated shape along a direction intersecting the extension direction of the first band-like insulating portion, the first band-like insulating portion located between two of the mounting pad portions and the second band-like insulating portion located between two of the mounting pad portions, both ends of the first band-like portion extending to a position which is a certain distance apart from a peripheral end of the rear surface,
wherein distances between the LED chips range from 100 μm to 150 μm.

36. An LED (Light Emitting Diode) module, comprising:
a substrate including a main surface, a rear surface, a bottom surface, and at least one through-hole extending from the main surface to the rear surface, the main surface and the rear surface located opposite each other and having elongated rectangular shapes and the bottom surface interconnecting long sides of the main surface and the rear surface and serving as a mounting surface of the LED module;
a main surface electrode formed on the main surface;
a rear surface electrode located on the rear surface and including a plurality of mutually spaced-apart mounting pad portions;
at least one LED chip supported on the main surface of the substrate;
a wiring line formed in the substrate and including at least one pad formed on the main surface, the at least one pad electrically connected to the at least one LED chip; and
an insulating film formed on the rear surface, and including a first band-like insulating portion extending in an elongated shape and a second band-like insulating portion extending in an elongated shape along a direction intersecting the extension direction of the first band-like insulating portion, the first band-like insulating portion located between two of the mounting pad portions and the second band-like insulating portion located between two of the mounting pad portions, both ends of the first band-like portion extending to a position which is a certain distance apart from a peripheral end of the rear surface,
at least one penetration electrode formed on an inner surface of the at least one through-hole to electrically interconnect the pad and the rear surface electrode.

37. The LED module of claim 36, wherein the wiring line is not formed on the bottom surface of the substrate.

38. The LED module of claim 36, wherein the number of said at least one LED chip is three and the three LED chips are arranged along a longitudinal direction of the main surface and spaced apart from one another.

39. The LED module of claim 38, wherein the number of said at least one through-hole is three and the number of said at least one penetration electrode is three.

40. The LED module of claim 39, further comprising:
a first wire,
wherein said at least one pad of the wiring line includes a bonding pad and one of the three LED chips and the bonding pad are interconnected via the first wire, and
wherein one of the three through-holes and the bonding pad overlap with each other when viewed in a thickness direction of the substrate and one of the three penetration electrodes and the bonding pad are electrically connected to each other.

41. The LED module of claim 40, wherein said at least one pad of the wiring line includes two die bonding pads to which two of the three LED chips are die-bonded, the two die bonding pads overlapping with two of the three through-holes when viewed in the thickness direction of the substrate.

42. The LED module of claim 41, wherein the rear surface electrode includes two individual electrodes electrically connected to the two die bonding pads through two of the three penetration electrodes.

43. The LED module of claim 42, wherein the substrate includes a pair of side surfaces interconnecting both ends of the main surface in the longitudinal direction and both ends of the rear surface in the longitudinal direction, wherein two corner grooves extending in the thickness direction of the substrate to reach from the main surface to the rear surface are formed between the side surfaces and the bottom surface, and wherein the wiring line includes two corner groove wiring lines formed in the inner surfaces of the two corner grooves.

44. The LED module of claim 43, wherein the rear surface electrode includes an end portion common electrode connected to one of the two corner groove wiring lines and electrically connected to the three LED chips and an end portion individual electrode connected to the other of the two corner groove wiring lines and electrically connected to one of the three LED chips.

45. The LED module of claim 44, wherein the wiring line includes a rear surface junction wiring line formed in the rear surface to interconnect one of the three penetration electrodes, which is not electrically connected to the two individual electrodes, and the end portion common electrode.

46. The LED module of claim 45, further comprising:
an insulating film covering the rear surface electrode.

47. The LED module of claim 46, wherein the insulating film covers the rear surface junction wiring line.

48. The LED module of claim 46, wherein the insulating film exposes at least a portion of each of the individual electrodes.

49. The LED module of claim 48, wherein the insulating film covers portions of the individual electrodes connected to the rear surface junction wiring line.

50. The LED module of claim 49, wherein the insulating film exposes the end portion common electrode and the end portion individual electrode.

51. The LED module of claim 43, wherein each of the corner grooves has a quarter-circular cross section.

52. The LED module of claim 40, further comprising:
a second wire configured to interconnect one of the three LED chips and the bonding pad,
wherein the second wire includes a portion overlapping, when viewed in the thickness direction of the substrate, with one of the three LED chips to which the first wire is connected.

53. The LED module of claim 52, wherein the center of one of the three LED chips to which the first wire is connected is misaligned, when viewed in a transverse direction of the main surface, with the center of one of the three LED chips to which the second wire is connected.

54. The LED module of claim 53, wherein, when viewed in the thickness direction of the substrate, one of the three through-holes includes a portion overlapping with one of the three LED chips to which the second wire is connected and a portion protruding from said one of the three LED chips.

55. The LED module of claim 39, further comprising:
a reflector formed on the main surface and having a reflecting surface configured to surround the three LED chips; and
a transparent resin portion filled in a region surrounded by the reflecting surface to cover the three LED chips.

56. An LED (Light Emitting Diode) module, comprising:
a support unit including a recess part having a bottom surface and a side surface;
a first electrode arranged to be exposed on the bottom surface of the support unit;
a second electrode arranged to be spaced apart from the first electrode and exposed on the bottom surface of the support unit;
a third electrode arranged to be spaced apart from the first electrode and exposed on the bottom surface of the support unit, the first electrode being interposed between the second electrode and the third electrode when viewed in a first direction;
a fourth electrode arranged to be spaced apart from the first electrode, the second electrode, and the third electrode, the a fourth electrode overlapping with the third electrode when viewed in a second direction intersecting with the first direction;
a first LED chip arranged on the first electrode;
a second LED chip arranged on the first electrode to be spaced apart from the first LED chip, the second LED chip overlapping with the first LED chip when viewed in the second direction;
a third LED chip arranged on the first electrode to be spaced apart from the first LED chip and the second LED chip, the third LED chip overlapping with the first LED chip and the second LED chip when viewed in the second direction, and the first LED chip being interposed between the second LED chip and the third LED chip;
a first wire having a first end connected to a surface of the first LED chip and a second end connected to the first electrode;
a second wire having a first end connected to the surface of the first LED chip and a second end connected to the third electrode;
a third wire having a first end connected to a surface of the second LED chip and a second end connected to the first electrode;
a fourth wire having a first end connected to the surface of the second LED chip and a second end connected to the fourth electrode; and
a fifth wire having a first end connected to a surface of the third LED chip and a second end connected to the second electrode.

57. The LED module of claim 56, wherein a rear surface of the third LED chip is electrically connected to the first electrode.

58. The LED module of claim 56, wherein the third wire and the fourth wire extend toward the first LED chip in the second direction.

59. The LED module of claim 56, wherein the third LED chip is arranged between the second electrode and the third electrode in the first direction.

60. The LED module of claim 56, wherein at least one of the second LED chip and the third LED chip is electrically insulated from the first electrode.

61. The LED module of claim 56, wherein the support unit includes a rear surface that faces the bottom surface of the recess portion, and
wherein each of the first electrode, the second electrode, the third electrode, and the fourth electrode includes a penetration portion that extends through the support unit toward the rear surface of the support unit.

62. The LED module of claim 61, wherein each of the first electrode, the second electrode, the third electrode, and the fourth electrode includes a rear portion that is connected to the penetration portion and exposed from the rear surface of the support unit.

63. The LED module of claim 62, wherein the rear portion of the first electrode overlaps with the rear portion of the second electrode when viewed in the second direction.

64. The LED module of claim 56, wherein, when viewed in a third direction orthogonal to the first direction and the second direction, at least one of the first wire, the second wire, the third wire, the fourth wire, and the fifth wire extends to incline with respect to the first direction and the second direction.

65. The LED module of claim 56, wherein each of the first electrode, the second electrode, and the third electrode includes a wire bonding wiring section.

\* \* \* \* \*